United States Patent
Yamagata et al.

(10) Patent No.: US 8,460,769 B2
(45) Date of Patent: Jun. 11, 2013

(54) POWDERED SILICA, SILICA CONTAINER, AND METHOD FOR PRODUCING THEM

(75) Inventors: Shigeru Yamagata, Tokyo (JP); Tomomi Usui, Tokyo (JP)

(73) Assignee: Shin-Estu Quartz Products Co., Ltd., Tokyo (JP)

( * ) Notice: Subject to any disclaimer, the term of this patent is extended or adjusted under 35 U.S.C. 154(b) by 226 days.

(21) Appl. No.: 13/140,982

(22) PCT Filed: Sep. 1, 2010

(86) PCT No.: PCT/JP2010/005375
§ 371 (c)(1),
(2), (4) Date: Jun. 20, 2011

(87) PCT Pub. No.: WO2011/045888
PCT Pub. Date: Apr. 21, 2011

(65) Prior Publication Data
US 2011/0256330 A1 Oct. 20, 2011

(30) Foreign Application Priority Data

Oct. 14, 2009 (JP) ................................. 2009-237686

(51) Int. Cl.
| | | |
|---|---|---|
| *A47G 19/22* | (2006.01) | |
| *B28B 21/00* | (2006.01) | |
| *B28B 21/72* | (2006.01) | |
| *B28B 23/08* | (2006.01) | |
| *B29D 22/00* | (2006.01) | |
| *B29D 23/00* | (2006.01) | |
| *B32B 1/08* | (2006.01) | |
| *C03C 17/32* | (2006.01) | |
| *F16L 9/10* | (2006.01) | |

(52) U.S. Cl.
USPC ......... 428/34.6; 428/34.4; 428/426; 428/428; 65/17.3; 65/17.5; 65/17.6

(58) Field of Classification Search
USPC ................. 428/34.4, 34.6, 426, 428; 65/17.3, 65/17.5, 17.6
See application file for complete search history.

(56) References Cited

U.S. PATENT DOCUMENTS

| 4,935,046 A | 6/1990 | Uchikawa |
|---|---|---|
| 6,660,671 B2 | 12/2003 | Werdecker et al. |

(Continued)

FOREIGN PATENT DOCUMENTS

| JP | B2-4-22861 | 4/1992 |
|---|---|---|
| JP | B2-7-29871 | 4/1995 |

(Continued)

OTHER PUBLICATIONS

May 24, 2012 Translation of International Preliminary Report on Patentability issued in International Patent Application No. PCT/JP2010/005375.

(Continued)

*Primary Examiner* — Michael C Miggins
(74) *Attorney, Agent, or Firm* — Oliff & Berridge, PLC

(57) ABSTRACT

A method is provided for producing a silica container arranged with a substrate, having a rotational symmetry, comprised of mainly a silica, and containing gaseous bubbles at least in its peripheral part, and an inner layer, formed on an inner surface of the substrate and comprised of a transparent silica glass; wherein a powdered silica, having particle diameter of 10 to 1000 μm, containing Ca, Sr, and Ba with the total concentration of 50 to 5000 ppm by weight, and releasing hydrogen molecules with the amount of $3\times10^{16}$ to $3\times10^{19}$ molecules/g upon heating at 1000° C. under vacuum, is prepared at least as a powdered raw material for forming the inner layer, and then the inner layer is formed from the powdered silica as the powdered raw material for forming the inner layer.

19 Claims, 9 Drawing Sheets

U.S. PATENT DOCUMENTS

| | | |
|---|---|---|
| 2003/0012899 A1 | 1/2003 | Kemmochi et al. |
| 2004/0025783 A1 | 2/2004 | Ohama et al. |
| 2007/0051297 A1 | 3/2007 | Kemmochi et al. |

FOREIGN PATENT DOCUMENTS

| | | |
|---|---|---|
| JP | A-7-206451 | 8/1995 |
| JP | A-7-277743 | 10/1995 |
| JP | A-7-277744 | 10/1995 |
| JP | A-8-2932 | 1/1996 |
| JP | A-2001-261353 | 9/2001 |
| JP | A-2002-362932 | 12/2002 |
| JP | A-2003-95678 | 4/2003 |
| JP | A-2003-335513 | 11/2003 |
| JP | A-2004-131380 | 4/2004 |
| JP | A-2005-145731 | 6/2005 |
| JP | A-2007-326780 | 12/2007 |
| JP | A-2008-81398 | 4/2008 |

OTHER PUBLICATIONS

Jan. 31, 2012 Office Action issued in Japanese Patent Application No. 2009-237686 (with partial translation).

Dodd et al., "Optical Determinations of OH in Fused Silica," Journal of Applied Physics, 1966, pp. 3911, vol. 37.

Nasu et al., "Gas release of various kinds of vitreous silica," Journal of Illuminating Engineering Institute of Japan, 1990, pp. 595-600, vol. 74—No. 9.

Khotimchenko et al., "Determining the content of hydrogen dissolved in quartz glass using the methods of raman scattering and mass spectrometry," Journal of Applied Spectroscopy, 1987, pp. 632-635, vol. 46—No. 6.

International Search Report mailed Dec. 7, 2010 issued in International Patent Application No. PCT/JO2010/005375 (with translation).

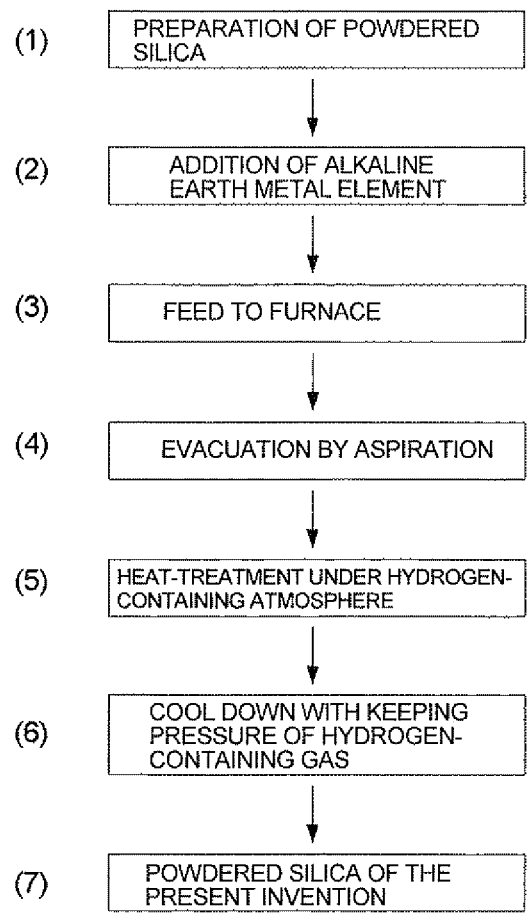
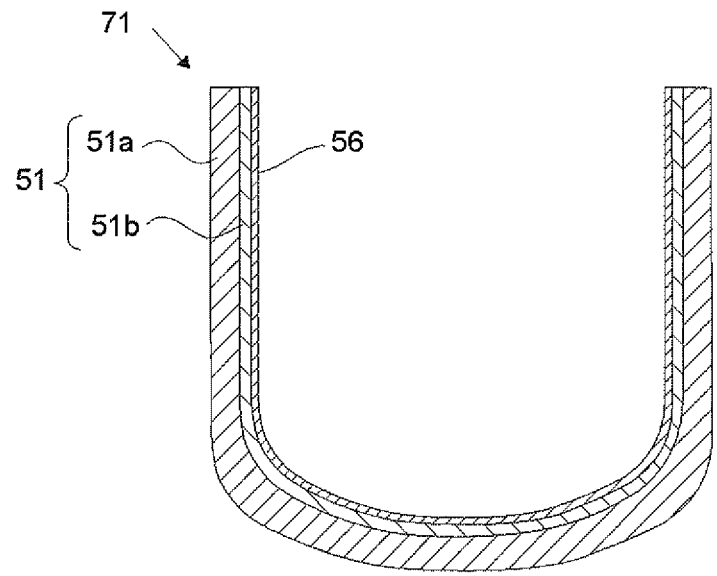

POWDERED SILICA, SILICA CONTAINER, AND METHOD FOR PRODUCING THEM

TECHNICAL FIELD

The present invention provides a silica container mainly comprised of silica, a method for producing the silica container, a powdered silica for producing the silica container, and a method for producing the powdered silica.

BACKGROUND ART

A silica glass is used for a lens, a prism and a photomask of a photolithography instrument in manufacturing of a large-scale integrated circuit (LSI), for a TFT substrate used for a display, for a tube of a lamp, for a window material, for a reflection plate, for a cleaning container in a semiconductor industry, for a container for melting of a silicon semiconductor, and so forth. However, an expensive compound such as silicon tetrachloride must be used as a raw material for these silica glasses; on top of that, melting temperature and processing temperature of a silica glass is extraordinary high, as high as about 2000° C., thereby leading to a high energy consumption and a high cost. Accordingly, from the past, various methods for producing a silica glass have been proposed.

For example, in Patent Document 1, a method (sol-gel method) in which a silicon alkoxide is hydrolyzed to a silica sol, which is then gelated to a wet gel, then to a dry gel by drying, and finally to a transparent silica glass body by heating at high temperature is disclosed. In Patent Document 2, a method in which a transparent silica glass is obtained by a sol-gel method from a silica sol mixture solution formed of tetramethoxy silane or tetraethoxy silane and a silica sol solution containing silica fine particles is disclosed. In Patent Document 3, a method for producing a transparent silica glass by using a silicon alkoxide and silica glass fine particles as its main raw materials, wherein a heating process at a temperature range of 200 to 1300° C. is carried out under an oxygen gas-containing atmosphere, a further heating process to 1700° C. or higher is carried out under a hydrogen gas-containing atmosphere, and a heating process between the foregoing two heating processes is carried out under a reduced pressure atmosphere, is disclosed. In these conventional sol-gel methods, however, the produced silica glass has problems not only in an initial dimensional precision of the produced silica glass and in a heat resistance during its use thereafter at high temperature but also in its production cost which is not so cheap.

In Patent Document 4, a method (slip casting method), wherein at least two different kinds of silica glass particles, for example, silica glass fine particles and silica glass granules are mixed to obtain a water-containing suspension solution, which is then press molded and sintered at high temperature to obtain a silica-containing composite body, is disclosed. In Patent Document 5, a method, wherein a mixed solution (slurry) containing silica glass particles having the size of 100 μm or less and silica glass granules having the size of 100 μm or more is prepared, then the slurry is cast into a molding frame, dried, and then sintered to obtain an opaque silica glass composite material, is disclosed. In these conventional slip casting methods, however, shrinkage of a molded article in a drying process and a sintering process is so significant that a thick silica glass article with a high dimensional precision could not be obtained.

Accordingly, there are problems in each method for producing a silica glass article as mentioned above. Therefore, as a method for producing a silica crucible for manufacturing of a single crystal silicon used for LSI (for a device), such production methods as those disclosed in Patent Document 6 and Patent Document 7 are being used still today. In these methods, after a powdered, ultra-highly purified natural quartz or a powdered synthetic cristobalite is fed into a rotating frame made of carbon and then molded, carbon electrodes are inserted from the top and then electrically charged thereby causing arc discharge to raise the atmospheric temperature to a temperature range for melting of the powdered quartz (temperature is estimated in the range from about 1800 to about 2100° C.) so that the powdered raw quartz may be melted and sintered.

In the methods such as those mentioned above, however, there has been a problem of a high cost because a powdered raw material quartz with high purity is used. In addition, because various kinds of impure gases are dissolved in a produced silica crucible, the gases are released and then incorporated into a silicon single crystal as gaseous bubbles thereby causing such problems as defects called a void and a pinhole when it is used as a silica crucible for growing of a silicon single crystal; and thus this has been causing problems in production cost as well as quality of the silicon crystal. In addition, there has been a big problem in durability of the silica crucible because of low etching resistance to silicon melt at the time of pulling up of a single crystal silicon.

A method to improve the etching resistance to the silicon melt in a silica crucible for pulling up of the single crystal is shown in Patent Document 8. In Patent Document 8, an effect of applying a crystallization accelerator on an inner surface of a silica glass crucible is shown. As the crystallization accelerator, Mg, Sr, Ca, and Ba, which are alkaline earth metal elements belonging to the 2a group, and Al, which is the element belonging to the 3b group, are shown. However, a silica glass crucible as shown in Patent Document 8 was not the one having a transparent silica glass layer completely free from gaseous bubbles at an inner surface part of the crucible, but the one containing micro gaseous bubbles and inhomogeneously undissolved particles of various doped elements. Accordingly, there have been problems frequently that a pulled-up silicon single crystal contains silica fine particles as foreign substances and has defects such as voids and pinholes.

Patent Document 9 shows a technology to reduce gaseous bubbles in a silica glass of an inner surface part of a silica crucible for pulling-up of a single crystal so that bubble expansion in the silica crucible in use may be suppressed. In Patent Document 9, it is shown that expansion of the gaseous bubbles in an inner surface of the silica crucible, generated during pulling-up of a single crystal at high temperature and under reduced pressure, can be suppressed by incorporating hydrogen molecules into a powdered raw material for the silica crucible with the concentration of $5 \times 10^{17}$ to $3 \times 10^{19}$ molecules/cm$^3$. In this method, however, there still has been a problem in durability of the silica crucible because of low etching resistance to silicon melt at the time of pulling up of a single crystal silicon.

CITATION LIST

Patent Document

Patent Document 1: Japanese Patent Application Laid-Open Publication No. H07-206451
Patent Document 2: Japanese Patent Application Laid-Open Publication No. H07-277743

Patent Document 3: Japanese Patent Application Laid-Open Publication No. H07-277744

Patent Document 4: Japanese Patent Application Laid-Open Publication No. 2002-362932

Patent Document 5: Japanese Patent Application Laid-Open Publication No. 2004-131380

Patent Document 6: Japanese Examined Patent Application Publication No. H04-22861

Patent Document 7: Japanese Examined Patent Application Publication No. H07-29871

Patent Document 8: Japanese Patent Application Laid-Open Publication No. H08-2932

Patent Document 9: Japanese Patent Application Laid-Open Publication No. 2007-326780

SUMMARY OF THE INVENTION

Technical Problem to be Solved by the Invention

The present invention was made in view of the problems as mentioned above, and has an object to provide a method for producing a silica container comprised of mainly a silica and having a thick transparent silica glass layer not substantially containing gaseous bubbles in its inner wall as well as a high durability at high temperature, can be produced with a high dimensional precision and with a low cost by using powders comprised of mainly a silica as its main raw material; the silica container of this sort; a powdered silica to produce the silica container of this sort; and a method for producing the powdered silica of this sort.

Solution to Problem

The present invention was made in order to solve the problems as mentioned above and provides a powdered silica for producing a silica container, wherein the powdered silica has particle diameter of 10 to 1000 μm, contains Ca, Sr, and Ba with the total concentration of 50 to 5000 ppm by weight, and releases hydrogen molecules with the amount of $3 \times 10^{16}$ to $3 \times 10^{19}$ molecules/g upon heating at 1000° C. under vacuum.

If the powdered silica like the one mentioned above, having particle diameter of 10 to 1000 μm, containing alkaline earth metal elements of Ca, Sr, and Ba with the total concentration of 50 to 5000 ppm by weight, and releasing hydrogen molecules with the amount of $3 \times 10^{16}$ to $3 \times 10^{19}$ molecules/g upon heating at 1000° C. under vacuum, is used as a raw material for producing a silica container, a high inhibiting effect of impurity diffusion, a high durability, and the like during the time that the silica container is used at high temperature can be obtained; and in addition, generation of gaseous bubbles in the part where the powdered silica is used can be effectively suppressed.

In this case, it is preferable that the powdered silica contain Al with the concentration of 10 to 100 ppm by weight.

Accordingly, when the powdered silica containing Al with the concentration of 10 to 100 ppm by weight is used, an alkaline earth metal element such as Ba can be dissolved further uniformly in a produced silica container.

In addition, it is preferable that the powdered silica contain Ba with the concentration of 100 to 1000 ppm by weight, release hydrogen molecules with the amount of $5 \times 10^{16}$ to $5 \times 10^{18}$ molecules/g upon heating at 1000° C. under vacuum, and contain Li, Na, and K with the concentration of each being 60 or less ppb by weight.

When the powdered silica, containing Ba, releasing hydrogen molecules, and containing Li, Na, and Ka, in the conditions as mentioned above, is used, a silica container produced from the powdered silica can have further surely a high inhibiting effect of impurity diffusion, a high durability, and the like; and in addition, generation of gaseous bubbles can be effectively suppressed, and purity of the inner wall of the silica container can be made adequately high.

In addition, the present invention provides a method for producing a powdered silica for production of a silica container, wherein the method includes:

a step of preparing powders having particle diameter of 10 to 1000 μm and comprised of a silica containing at least one of Ca, Sr, and Ba, a step of feeding the powders into an air-tight furnace, a step of evacuating inside the furnace to $10^3$ Pa or lower by aspiration, a step of conducting heat-treatment at 200 to 800° C. with introducing a gas containing 10 to 100% by volume of a hydrogen gas into the furnace whereby making a pressure of the hydrogen-containing atmosphere between 1 and 100 kgf/cm$^2$, and a step of cooling the powders to 50° C. or lower with maintaining the pressure of the hydrogen-containing atmosphere inside the furnace at 1 kgf/cm$^2$ or higher.

According to the method for producing a powdered silica as mentioned above, when the powdered silica thus obtained is used as a raw material for producing a silica container having a high inhibiting effect of impurity diffusion, a high durability, and the like during its use at high temperature can be obtained; and in addition, the powdered silica with effectively suppressed generation of gaseous bubbles in the part where the powdered silica is used can be obtained.

In this case, it is preferable that the powdered silica be made to contain Ca, Sr, and Ba with the total concentration of 50 to 5000 ppm by weight.

When the powdered silica is made to contain Ca, Sr, and Ba with the concentration as mentioned above, a silica container obtained from the powdered silica can have further surely a high inhibiting effect of impurity diffusion, a high durability, and the like; and in addition, generation of gaseous bubbles can be sufficiently suppressed.

In addition, it is preferable that the powdered silica be made to contain Ba with the concentration of 100 to 1000 ppm by weight and Al with the concentration of 10 to 100 ppm by weight, respectively.

When the powdered silica is made to contain Ba and Al with the concentration as mentioned above, a silica container obtained from the powdered silica can have further surely a high inhibiting effect of impurity diffusion, a high durability, and the like. In addition, by incorporating Al, an alkaline earth metal element such as Ba can be dissolved further uniformly; and thus generation of gaseous bubbles in inner wall of the silica container can be suppressed further effectively.

In addition, the present invention provides a silica container arranged with a substrate, having a rotational symmetry, comprised of mainly a silica, and containing gaseous bubbles at least in its peripheral part, and an inner layer, formed on an inner surface of the substrate and comprised of a transparent silica glass; wherein the substrate contains Li, Na, and K with the total concentration of 50 or less ppm by weight, and the inner layer contains Ca, Sr, and Ba with the total concentration of 50 to 5000 ppm by weight and shows a light transmittance of 91.8 to 93.2% at a light wavelength of 600 nm for a cut-out sample having 10 mm thickness.

The silica container having such a composition can be given in its inner wall a high inhibiting effect of impurity diffusion, a high durability, and the like during the time that the silica container is used at high temperature, in spite of a low cost silica container having adequate temperature uniformity; and in addition, generation of gaseous bubbles in the inner wall can be effectively suppressed. As a result, a harmful effect to a material accommodated in the silica container due to the gaseous bubbles generated in the inner wall of the silica container can be suppressed. Meanwhile, the light transmittance reflects amount of gaseous bubbles in a glass and uniform solubility of a doped element.

In this case, it is preferable that the inner layer contain Al with the concentration of 10 to 100 ppm by weight.

Accordingly, when the inner layer is made to contain Al with the concentration of 10 to 100 ppm by weight, an alkaline earth metal element such as Ba can be dissolved further uniformly, so that generation of gaseous bubbles in the inner wall of a silica container can be suppressed further effectively.

In addition, it is preferable that the inner layer contain Li, Na, and K with the concentration of each being 60 or less ppb by weight, contain Ba with the concentration of 100 to 1000 ppm by weight, and release hydrogen molecules from a sample cut-out from the inner layer with the amount of less than $1 \times 10^{16}$ molecules/g upon heating at $1000°$ C. under vacuum.

Accordingly, when the inner layer contains Li, Na, and K with the concentration of each being 60 or less ppb by weight, contains Ba with the concentration of 100 to 1000 ppm by weight, and releases hydrogen molecules from a sample cut-out from the inner layer with the amount of less than $1 \times 10^{16}$ molecules/g upon heating at $1000°$ C. under vacuum, a high inhibiting effect of impurity diffusion, a high durability, and the like can be obtained further surely; and in addition, generation of gaseous bubbles can be effectively suppressed, and purity of the inner wall of a silica container can be made adequately high.

In addition, the present invention provides a method for producing a silica container arranged with a substrate, having a rotational symmetry, comprised of mainly a silica, and containing gaseous bubbles at least in its peripheral part, and an inner layer, formed on an inner surface of the substrate and comprised of a transparent silica glass; wherein a powdered silica, having particle diameter of 10 to 1000 μl, containing Ca, Sr, and Ba with the total concentration of 50 to 5000 ppm by weight, and releasing hydrogen molecules with the amount of $3 \times 10^{16}$ to $3 \times 10^{19}$ molecules/g upon heating at $1000°$ C. under vacuum, is prepared at least as a powdered raw material for forming the inner layer, and then the inner layer is formed on an inner surface of the substrate by using the powdered silica as the powdered raw material for forming the inner layer.

Accordingly, if the method for producing a silica container at least whose inner layer is formed by a powdered silica, having particle diameter of 10 to 1000 μm, containing Ca, Sr, and Ba with the total concentration of 50 to 5000 ppm by weight, and releasing hydrogen molecules with the amount of $3 \times 10^{16}$ to $3 \times 10^{19}$ molecules/g (as the concentration of a hydrogen molecule) upon heating at $1000°$ C. under vacuum, is used, a high inhibiting effect of impurity diffusion, a high durability, and the like during the time that the silica container is used at high temperature, can be obtained; and in addition, generation of gaseous bubbles in the inner wall of a silica container can be effectively suppressed.

The method for producing a silica container of the present invention can include:

a step of preparing powders containing Li, Na, and K with the total concentration of 50 or less ppm by weight and having particle diameter of 10 to 1000 μm as a powdered raw material for forming the substrate, a step of forming a preliminarily molded substrate, wherein, while rotating an evacuable outer frame having a rotational symmetry and aspiration holes arranged splittingly in its inner wall, the powdered raw material for forming the substrate is fed to an inner wall of the evacuable outer frame and then preliminarily molded to an intended shape in accordance with the inner wall of the evacuable outer frame, a step of forming a preliminarily molded inner layer, wherein, while rotating the evacuable outer frame, the powdered silica prepared as the powdered raw material for forming the inner layer is fed onto an inner surface of the preliminarily molded substrate and then preliminarily molded to an intended shape in accordance with an inner surface of the preliminarily molded substrate, and a step of forming the substrate and the inner layer, wherein the preliminarily molded substrate and inner layer are degassed by aspiration from an outer peripheral side of the preliminarily molded substrate through the aspiration holes formed in the evacuable outer frame with heating from inside of the preliminarily molded substrate and inner layer by a discharge-heat melting method thereby making an outer peripheral part of the preliminarily molded substrate to a sintered body while an inner side part of the preliminarily molded substrate and the preliminarily molded inner layer to a fused glass body.

Further, the method for producing a silica container of the present invention can include:

a step of preparing powders containing Li, Na, and K with the total concentration of 50 or less ppm by weight and having particle diameter of 10 to 1000 μm as a powdered raw material for forming the substrate, a step of forming a preliminarily molded substrate, wherein, while rotating an evacuable outer frame having a rotational symmetry and aspiration holes arranged splittingly in its inner wall, the powdered raw material for forming the substrate is fed to an inner wall of the evacuable outer frame and then preliminarily molded to an intended shape in accordance with the inner wall of the evacuable outer frame, a step of forming the substrate, wherein the preliminarily molded substrate is degassed by aspiration from its outer peripheral side through aspiration holes formed in the evacuable outer frame with heating at high temperature from inside of the preliminarily molded substrate by a discharge-heat melting method thereby making an outer peripheral part of the preliminarily molded substrate to a sintered body while an inner side part to a fused glass body, and a step of forming the inner layer on an inner surface of the substrate, wherein the powdered silica prepared as the powdered raw material for forming the inner layer is spread from inside of the substrate with heating at high temperature from its inside by a discharge-heat melting method.

In this case, the step of forming the inner layer may also be conducted with degassing through aspiration holes formed in the evacuable outer frame.

Further, the method for producing a silica container of the present invention can include:

a step of preparing powders containing Li, Na, and K with the total concentration of 50 or less ppm by weight and having particle diameter of 10 to 1000 μm as a powdered raw material for forming the substrate, a step of forming a preliminarily molded substrate, wherein the powdered raw material for forming the substrate is fed to an inner wall of an outer frame having a rotational symmetry and then preliminarily molded to an intended shape in accordance with the inner wall of the outer frame, a step of forming a substrate by heating at high temperature from an inner side of the preliminarily molded substrate by a discharge-heat melting method, and a step of forming the inner layer on an inner surface of the substrate, wherein the powdered silica prepared as the powdered raw material for forming the inner layer is spread from inside of the substrate with heating at high temperature from its inside by a discharge-heat melting method.

Accordingly, in the method for producing a silica container by the present invention, after the substrate and the inner layer are preliminarily molded, both the preliminarily molded articles thereby stacked may be heated simultaneously; or alternatively, heating may be conducted with spreading the powdered inner-layer's raw material (powdered silica) after the substrate is formed by preliminarily molding the substrate followed by melting and sintering of the preliminarily molded substrate thus obtained. In addition, any of the discharge-heat melting steps may be conducted under normal pressure as well as under aspiration.

In the method for producing a silica container by the present invention, at least one of the discharge-heat melting steps may be carried out under a mixed atmosphere of an inert gas containing 1 to 30% by volume of an oxygen gas.

Accordingly, when at least one of the discharge-heat melting steps is carried out under a mixed atmosphere of an inert gas containing 1 to 30% by volume of an oxygen gas, carbon particles from carbon electrodes can be gasified to CO and $CO_2$ by oxidation, so that a silica container with few carbon (C) fine particles can be obtained.

In addition, in the method for producing a silica container by the present invention, at least one of the discharge-heat melting steps may be carried out under an air atmosphere with setting a dew-point temperature in the range between 10 and $-10°$ C. and with controlling the dew-point temperature within $\pm 1°$ C. of the set temperature.

Accordingly, when at least one of the discharge-heat melting steps is carried out under an air atmosphere with setting a dew-point temperature in the range between 10 and $-10°$ C. and with controlling the dew-point temperature within $\pm 1°$ C. of the set temperature, amount of an OH group and amount of water ($H_2O$) contained in the silica container can be reduced in spite of low cost.

Advantageous Effects of the Invention

As described above, according to the powdered silica of the present invention, if the powdered silica is used as a raw material for forming an inner layer of a silica container, a high inhibiting effect of impurity diffusion, a high durability, and the like during the time that the silica container is used at high temperature can be obtained; and in addition, generation of gaseous bubbles in the part where the powdered silica is used can be effectively suppressed. In addition, according to the method for producing a powdered silica of the present invention, a powdered silica having the foregoing effects can be produced.

The silica container according to the present invention can be given in its inner wall a high inhibiting effect of impurity diffusion, a high durability, and the like during its use at high temperature, in spite of a low cost silica container having adequate uniformity of temperature; and in addition, generation of gaseous bubbles in the inner wall can be effectively suppressed. As a result, a harmful effect to a material accommodated in the silica container due to gaseous bubbles generated in the inner wall of the silica container can be suppressed.

According to the method for producing a silica container of the present invention, a high inhibiting effect of impurity diffusion, a high durability, and the like during the time that the produced silica container is used at high temperature can be obtained; and in addition, generation of gaseous bubbles in the inner wall of the silica container can be effectively suppressed.

BRIEF DESCRIPTION OF DRAWINGS

FIG. 1 is a flow chart showing outline of the method for producing a powdered silica of the present invention.

FIG. 2 is a schematic cross section view showing one example of the silica container of the present invention.

DESCRIPTION OF EMBODIMENTS

Figure 3:
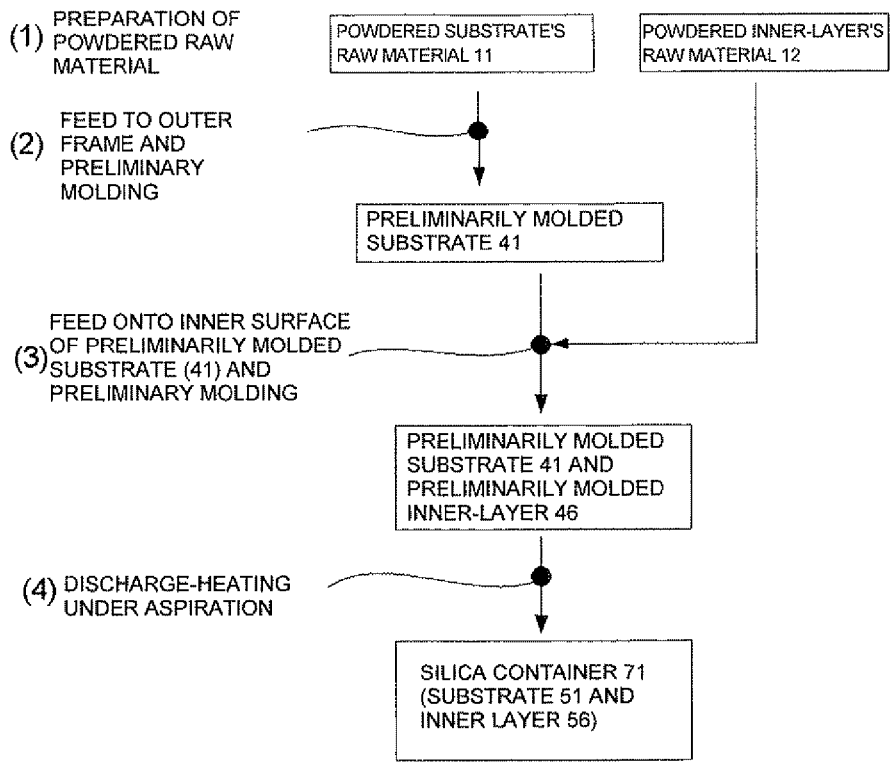
FIG. 3 is a flow chart showing outline of one example of the method for producing a silica container of the present invention.

As mentioned above, in a conventional method for producing a silica container, there have been problems in dimensional precision and cost.

In addition, a silica container produced by a conventional method for producing a silica container had a problem such as a harmful effect of gaseous bubbles to a material accommodated therein, for example, incorporation of gaseous bubbles into a silicon single crystal in a silica crucible for growing of a silicon single crystal.

The inventors carried out investigation in view of the problems as mentioned above and found the following problems to be solved.

Firstly, a silica container such as a crucible and a boat for melting of a metal silicon and for production of a silicon crystal requires thermal uniformity inside the container under atmosphere of a high heating temperature. Because of this, the first problem to be solved is to make the silica container at least a multi-layer structure, wherein an outside part of the container is made to a porous, white and opaque silica glass while an inside part of the container is made to a thick, colorless and transparent silica glass containing substantially little gaseous bubbles.

The second problem to be solved is to give a function to inhibit diffusion of an impure substance (impurity-shielding function). This is to suppress a harmful effect to a material accommodated in a silica container due to an impure substance contained in the silica container.

For example, if an impure metal element contained in the silica container, for example, not only an alkaline metal such as Li, Na, and K, but also Ti, Cr, Mn, Fe, Ni, Cu, Zn, Zr, Mo, and W, is incorporated into a silicon crystal during production of a silicon single crystal, it causes decrease in the incident photon-to-current conversion efficiency especially in a silicon device for solar use. Accordingly, in order to inhibit diffusion of an impure substance contained in the silica container into a silicon melt, inner surface of the silica container is made finely crystallized (made to a glass ceramics) so that a function to inhibit diffusion of an impure substance may be given. In addition, in view of quality of the finely crystallized part of the inner surface of the silica container having dimensionally fine and precise individual crystals, a crystallized layer is made of cristobalite and the like having fine texture.

The third problem is to give an etching resistance by finely crystallizing inner surface of the silica container with cristobalite and the like having fine texture.

For example, if a component of the silica container itself ($SiO_2$) is dissolved into a silicon melt during production of a silicon single crystal production thereby incorporating an oxygen element into the silicon crystal, there appears a problem such as, for example, to cause decrease in the incident photon-to-current conversion efficiency in a silicon device for solar use. Accordingly, the inner surface of the container is made to have characteristics not to be dissolved easily into a silicon melt (i.e., having an etching resistance to a silicon melt), that is, to make the inner surface of the container finely crystallized, similarly to the above.

In the case that alkaline earth metal elements Ca, Sr, and Ba are doped non-uniformly as a crystallization accelerator in the inner surface layer of the silica container and the inner surface layer contains fine gaseous bubbles, a gas contained therein is emitted from the gaseous bubbles and released into a silicon melt during production of a silicon single crystal, thereby causing structural defects called a pinhole and a void by incorporation of gas bubbles into the silicon crystal. Accordingly, the fourth problem is to give a thick glass layer which does not contain gaseous bubbles in the inner surface layer of the silica container but contains the alkaline earth metal elements uniformly dissolved thereby making a completely colorless and transparent glass having a high light transmittance.

As mentioned above, in the present invention, it was necessary to simultaneously solve these four technical problems with a lower cost as compare with a silica container such as a crucible, produced by a conventional method, for pulling up of a high purity single crystal silicon; accordingly, this is the fifth problem to be solved.

Hereinbelow, the present invention will be explained with referring to the figures, but the present invention is not limited to them. In particular in the following, a silica container (a solar-grade crucible) applicable as a container for melting of a metal silicon used as a material for a solar cell (a solar photovoltaic power generation, or a solar power generation) as well as a production method thereof will be mainly explained as one suitable example of application of the present invention; but the present invention is not limited to this and can be applied widely to a general silica container comprised of mainly a silica and having a rotational symmetry.

In FIG. 2, a schematic cross section view of one example of the silica container according to the present invention is shown.

The silica container 71 according to the present invention has a rotational symmetry, and its basic structure is comprised of the substrate 51 and the inner layer 56.

The substrate 51 has a rotational symmetry and is comprised of mainly a silica. The substrate 51 contains gaseous bubbles in the substrate's outer peripheral part 51a, namely, a porous, white and opaque layer part, and the substrate's inner peripheral part 51b is typically semi-transparent to transparent.

The inner layer 56 is formed on the inner surface of the substrate 51 and is comprised of a transparent silica glass.

The total concentration of Li, Na, and K in the substrate 51 is 50 or less ppm by weight. Further, the inner layer 56 contains Ca, Sr, and Ba with the total concentration of 50 to 5000 ppm by weight and shows a light transmittance of preferably 91.8 to 93.2%, or more preferably 92.4 to 93.2% at a light wavelength of 600 nm for a cut-out sample having 10 mm thickness.

Meanwhile, as far as the container of the present invention has at least the substrate 51 and the inner layer 56, the silica container may further contain a layer other than these layers.

The silica container 71 having a composition as mentioned above can have an adequate temperature uniformity with low cost. In other words, in the silica container, when at least the substrate's outer peripheral part 51a is made to a porous non-transparent silica body and at least the inner layer 56 is made to a thick transparent silica glass body not substantially containing gaseous bubbles, temperature uniformity inside the silica container 71 during the time that the silica container 71 is used at high temperature can be improved.

In addition, when the silica container 71 is used at high temperature between 1400 and 1600° C., if the inner layer 56 is made to contain at least one of Ca, Sr, and Ba, especially Ba as mentioned above, a surface part of the silica glass can be recrystallized as cristobalite and the like; and as a result, elution by diffusion of an alkaline metal element such as Na, K, and Li contained in the substrate 51 of the silica container 71 can be prevented, and in addition, etching of an inner surface of the silica container 71 by a material accommodated therein, such as a metal silicon melt, which is treated in the silica container 71, can be reduced.

In addition, according to the present invention, generation of gaseous bubbles in the inner layer 56 can be effectively suppressed. As a result, a harmful effect to a material accommodated therein, due to generation of gaseous bubbles in an inner wall of the silica container 71, can be suppressed.

Meanwhile, if gaseous bubbles in the inner layer 56 is adequately reduced and an alkaline earth metal element such as Ba is uniformly dissolved, a light transmittance at a light wavelength of 600 nm for the sample having 10 mm thickness cut out from the inner layer 56 becomes 91.8 to 93.2%. If the gaseous bubbles are further reduced to nil and the alkaline earth metal element is uniformly dissolved, the light transmittance becomes 92.4 to 93.2%. Among the values, the upper limit value 93.2% is theoretically the maximum value in the silica glass.

If the inner layer 56 is made to contain Al with the concentration of 10 to 100 ppm by weight, not only a further enhanced inhibition effect of impurity diffusion can be given but also the alkaline earth metal element such as Ba can be dissolved further uniformly. Accordingly, generation of gaseous bubbles in an inner wall of the silica container can be suppressed further effectively.

Details of a mechanism for Al to prevent migration and diffusion of an impure metal element in the silica glass from occurring is not known; but it is assumed that, because of difference in the coordination number by displacing a Si atom with an Al atom, a positive ion (cation) of an impure alkaline metal element such as $Li^+$, $Na^+$, and $K^+$ is adsorbed and its diffusion is inhibited in order to keep the electric charge balance within a silica glass network.

It is assumed that displacement of a Si atom with an Al atom has an effect to also immobilize a positive ion of an alkaline earth metal element such as $Ba^{2+}$ in order to keep the electric charge balance so that the element such as Ba can be dissolved uniformly; and because of this, gaseous bubbles in the silica glass can be suppressed as well.

It is preferable that each concentration of Li, Na, and K in the inner layer 56 be made 60 or less ppb by weight so that purity of the part with which the silica container 71 contacts a material accommodated therein may be adequately high. In addition, by making concentration of Ba in the inner layer 56 in the range between 100 and 1000 ppm by weight, a high inhibition effect of impurity diffusion, durability, and the like can be obtained further surely.

In addition, it is preferable that the release amount of hydrogen molecules upon heating the sample cut out from the inner layer 56 at 1000° C. under vacuum be less than $1 \times 10^{16}$ molecules/g to suppress generation of gaseous bubbles further effectively.

As mentioned above, it is necessary that the inner surface layer part of the silica container 71 (namely, the inner layer 56) be made not to contain fine gaseous bubbles as far as possible. The reason for this is as follows. For example, when a metal silicon is melted in the silica container 71, the inner surface layer part of the silica container is dissolved by etching to some extent; in this case, if fine gaseous bubbles are contained in the inner surface layer part, a gas contained in the gaseous bubbles is released into a melted silicon, resulting in formation of an air space or a defect called a void and a pinhole in a silicon wafer, when the melted silicon is processed to, for example, the silicon wafer for a solar use.

In order not to contain fine gaseous bubbles in a silica glass, it is necessary that the powdered silica raw material containing a hydrogen gas ($H_2$) be produced simultaneously at the time of containing (doping) a crystallization accelerating element of an alkaline earth metal element such as Ca, Sr, and Ba. Specifically, the powdered silica is made to have particle diameter of 10 to 1000 μm, contain Ca, Sr, and Ba with the total concentration of 50 to 5000 ppm by weight, and release hydrogen molecules with the amount of $3 \times 10^{16}$ to $3 \times 10^{19}$ molecules/g upon heating at 1000° C. under vacuum. Preferably, the powdered silica is made to contain Ba with the concentration of 100 to 1000 ppm by weight and hydrogen molecules with the amount of $5 \times 10^{16}$ to $5 \times 10^{18}$ molecules/g.

In addition, if the powdered silica is made to contain Al with the concentration of 10 to 100 ppm by weight, an alkaline earth metal element such as Ba can be dissolved further uniformly.

Namely, as the additives to a powdered silica, a combination of 50 to 5000 ppm by weight of alkaline earth metal elements of Ca, Sr, and Ba (preferably 100 to 1000 ppm by weight of Ba) and $3 \times 10^{16}$ to $3 \times 10^{19}$ molecules/g of hydrogen molecules (preferably $5 \times 10^{16}$ to $5 \times 10^{18}$ molecules/g), or the combination further with, in addition to them, 10 to 100 ppm by weight of Al, is extremely important to dissolve a crystallization accelerator uniformly into a silica glass without incorporating fine gaseous bubbles. These perceptions have not been reported previously, but were figured out and demonstrated for the first time by the inventors.

It is important that a crystallization accelerator such as Ba is doped uniformly without incorporating gaseous bubbles into a silica glass after melting. Detailed mechanism is not clear, but it is assume that a hydrogen molecule ($H_2$) reacts with an oxygen molecule ($O_2$) having a large molecular diameter to form a water molecule ($H_2O$) having a small molecular diameter, which can be diffused and released easily, so that generation of gaseous bubbles may be prevented. In addition, a hydrogen molecule itself has a small molecular diameter so that its diffusion rate in a silica glass is fast; and thus it neither remains substantially in the obtained silica glass, nor causes formation of gaseous bubbles even if it remains to some extent. To dissolve a crystallization accelerator such as Ba uniformly into a silica glass is indispensable in order to form silica fine crystals abundantly and uniformly on surface part of the silica glass at the time when a silica container is used at high temperature. Although a detailed mechanism is not clear, in a silica glass prepared from the powdered silica raw material that is heat-treated under a hydrogen gas-containing atmosphere, a growth rate of a crystal such as cristobalite tends to be slower. Accordingly, if a powdered raw material is prepared by heat-treatment of a powdered silica containing Ba and the like under a hydrogen gas-containing atmosphere and then a silica container is prepared from the powdered raw material thus obtained, a fine and tight recrystallized layer can be formed at the time when the silica container is used. As the reason for this, it is assumed that the powdered silica raw material that is heat-treated under a hydrogen gas-containing atmosphere contains an oxygen defect and hydrogen molecules so that a silica glass prepared from the powdered raw material thus treated contains some sort of a structural defect, which may slow down appropriately the growth rate of crystals such as cristobalite. Accordingly, in order to form a recrystallized layer having fine texture on an inner surface of a silica container, it is necessary that the powdered silica raw material be made to contain hydrogen molecules with high concentration, together with a crystallization accelerator such as Ba.

A method for producing the powdered silica to be used as the powdered raw material for formation of the inner layer 56 as mentioned above will be explained specifically.

In FIG. 1, an outline of the method for producing the powdered silica according to the present invention is shown.

Firstly, as shown in FIG. 1 (1), a base material that is powders having particle diameter of 10 to 1000 μm and comprised of a silica is prepared.

The powdered raw material for forming the inner layer of the silica container may be exemplified by a powdered highly purified natural quartz, a powdered natural berg crystal, a powdered synthetic cristobalite, and a powdered synthetic silica glass. To reduce gaseous bubbles in a transparent layer, a powdered crystalline silica is preferable; and to obtain a transparent layer with highly purity, synthetic powders are preferable. Particle diameter is preferably 100 to 500 μm. Purity is preferably 99.9999% or higher by weight as the silica component ($SiO_2$), and content of each of the alkaline elements Li, Na, and K is 60 or less ppb by weight, or more preferably 20 or less ppb by weight. Content of each of Ti, V, Cr, Fe, Co, Ni, Cu, Zn, Mo, and W is preferably 30 or less ppb by weight, or more preferably 10 or less ppb by weight.

Then, as shown in FIG. 1 (2), an alkaline earth metal element is added to the powdered silica as the base material.

Specifically, the powdered silica is made to contain at least one or more of calcium (Ca), strontium (Sr), and barium (Ba), or preferably Ba. The method for addition may be as follows: before doping hydrogen molecules into the powdered raw material, a chloride, an acetate salt, a nitrate salt, or a carbonate salt of an alkaline earth metal element to be dissolved into water or an alcohol is selected, and then an aqueous solution or an alcohol solution of the selected compound is prepared, and then it is impregnated into the powdered silica raw material; and then, after drying the resulting mixture, the powders added with a specific element can be obtained.

Then, according to the steps shown in FIGS. 1 (3) to (6), a hydrogen gas is added to the powdered silica.

Specifically, at first the powdered silica is fed to an air-tight furnace (for example, an air-tight electric furnace with a stainless steel jacket), as shown in FIG. 1 (3). Then, inside the furnace is evacuated by aspiration, as shown in FIG. 1 (4). Thereafter, as shown in FIG. 1 (5), heat-treatment is carried out at 200 to 800° C., or preferably at 300 to 600° C., under an atmosphere containing 10 to 100% by volume of a hydrogen gas with a pressure of 1 to 100 kgf/cm$^2$ (about 1 to about 100 atmospheres, or about $9.8 \times 10^4$ to about $9.8 \times 10^6$ Pa), and for example, for about 1 to about 10 hours. Then, the temperature is lowered till 50° C. or lower with maintaining pressure of the hydrogen-containing atmosphere at 1 kgf/cm$^2$ or higher, as shown in FIG. 1 (6). It must be noted here that a gas that is mixed with a hydrogen gas in the hydrogen-containing atmosphere is an inert gas such as a nitrogen gas ($N_2$), an argon gas (Ar), and a helium gas (He).

According to the procedure shown above, the powdered silica of the present invention can be produced, as shown in FIG. 1 (7).

Meanwhile, if particle diameter of the powdered inner-layer's raw material is about 10 to about 1000 μm as mentioned above, amount of the released $H_2$ at 1000° C. under vacuum is almost the same as the dissolved amount of $H_2$ molecules in the powdered inner-layer's raw material because almost all of $H_2$ contained therein is released at 1000° C. under vacuum.

By using the powdered silica as mentioned above as the powdered raw material, the inner layer 56 of the silica container 71 according to the present invention is formed. That is, in the present invention, the inner layer 56 is formed by using the powdered silica, having particle diameter of 10 to 1000 μm, containing Ca, Sr, and Ba with the total concentration of 50 to 5000 ppm by weight, and releasing $3 \times 10^{16}$ to $3 \times 10^{19}$ molecules/g of hydrogen molecules upon heating at 1000° C. under vacuum, at least as the powdered raw material for forming the inner layer 56.

Hereinbelow, a method for producing a silica container 71 as mentioned above will be specifically explained. In particular, a method for producing a silica container (solar-grade crucible) producible with a low production cost, usable as a container for melting of a metal silicon (Si) used as a material for a solar photovoltaic power generation device and the like as well as for pulling up of a single crystal, will be explained as the example.

A schematic diagram of one example of a method for producing the silica container 71 according to the present invention (first embodiment) is shown in FIG. 3.

Firstly, as shown in FIG. 3 (1), a powdered silica as the powdered substrate's raw material 11 (silica particles) and a powdered silica as the powdered inner-layer's raw material 12 are prepared (Step 1).

As the powdered inner-layer's raw material 12, the powdered silica according to the present invention as described above is used. The method for its production is according to the procedures as described above (for example, the method shown in FIG. 1).

On the other hand, the powdered substrate's raw material 11 is the one that will become a main composition material of the substrate 51 in the silica container 71 of the present invention (refer to FIG. 2).

This powdered substrate's raw material can be obtained, for example as described below, by crushing mass of silica and then classifying the powders thereby obtained; though the method is not limited to it.

Firstly, a mass of natural silica (naturally produced berg crystal, quartz, silica, silica stone, opal stone, and so forth) having diameter of about 5 to about 50 mm is heated at 600 to 1000° C. for about 1 to about 10 hours under an air atmosphere. Then, the mass of natural silica thus treated is poured into water to be cooled down quickly, separated, and then dried. With these treatments, subsequent crushing by a crusher or the like and classification of the obtained powders can be carried out easily; but crushing treatment may be carried out without conducting the foregoing heating and quick cooling treatments.

Then, the mass of the natural silica is crushed by a crusher or the like, and then classified to particles having diameter of preferably 10 to 1000 μm, or more preferably 50 to 500 μm, to obtain a powdered natural silica.

Thereafter, the powdered natural silica thus obtained is heated at 700 to 1100° C. for about 1 to about 100 hours in a rotary kiln made of a silica glass tube having an inclination angle, inside of which is made to an atmosphere containing a hydrogen chloride gas (HCl) or a chlorine gas ($Cl_2$) for high-purification treatment. However, for the use not requiring a high purity, this high-purification treatment can be omitted to proceed to the subsequent steps.

The powdered substrate's raw material 11 obtained after the foregoing steps is of a crystalline silica; but depending on the use purpose of the silica container, an amorphous silica glass scrap may also be used as the powdered substrate's raw material 11.

Diameter of the powdered substrate's raw material 11 is preferably 10 to 1000 μm, or more preferably 50 to 500 μm, as mentioned above.

Silica purity of the powdered substrate's raw material 11 is preferably 99.99% or higher by weight, or more preferably 99.999% or higher by weight. In particular, total amount of Li, Na, and K is preferably 50 of less ppm by weight. Further, according to the method for producing a silica container of the present invention, even if silica purity of the powdered substrate's raw material 11 is relatively low, i.e., 99.999% or lower by weight, impurity contamination to a material accommodated in the produced silica container can be adequately avoided. Accordingly, the silica container can be produced with a lower cost as compared with conventional methods.

Meanwhile, the powdered substrate's raw material 11 may be made to further contain Al with the concentration of 10 to 500 ppm by weight.

Al can be contained in the powdered silica by feeding the powdered silica into an aqueous or an alcohol solution of an Al salt such as a nitrate salt, an acetate salt, an carbonate salt, or a chloride for soaking, and then by drying.

Then, as shown in FIG. 3 (2), the powdered substrate's raw material 11 thus prepared is fed into an outer frame having a rotational symmetry for molding the powdered substrate's raw material 11 (Step 2).

Figure 5:
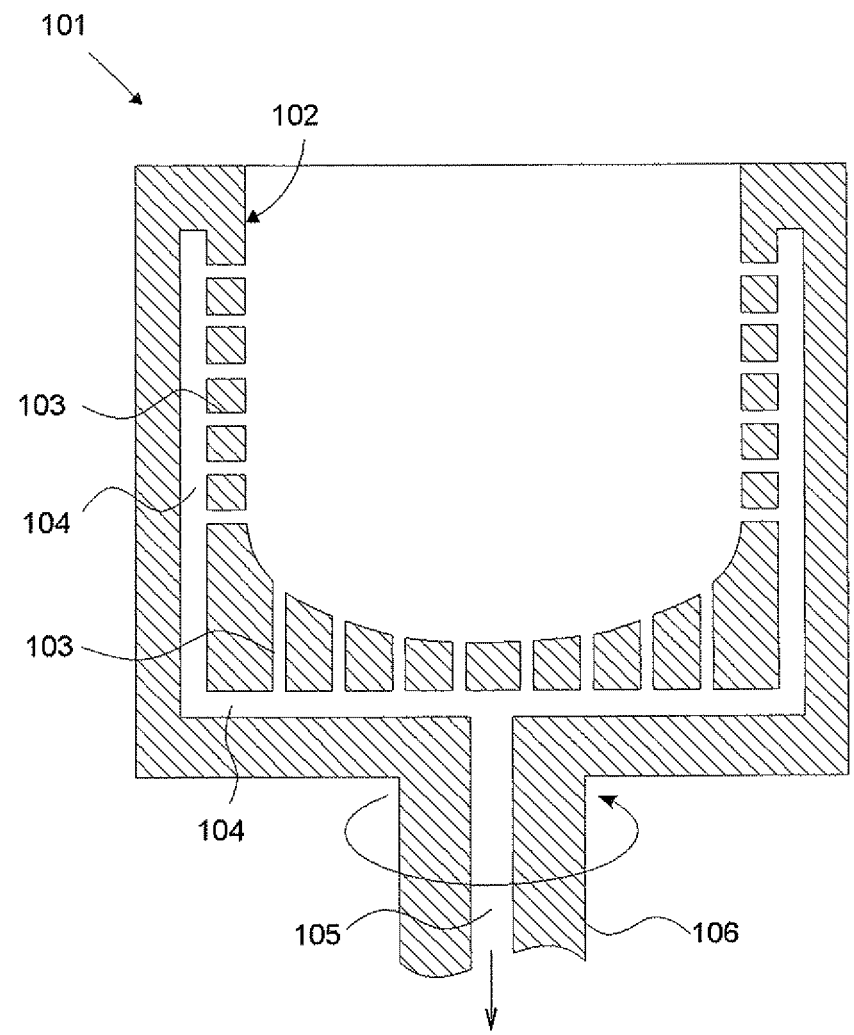
FIG. 5 is a schematic cross section view showing one example of the outer frame usable in the method for producing a silica container of the present invention.

In FIG. 5, a cross section view showing an outline of the evacuable outer frame is illustrated, as one example of the outer frame to preliminarily mold the powdered substrate's raw material 11. The evacuable outer frame 101 is made of a member such as, for example, graphite, and has a rotational symmetry. In the inner wall 102 of the evacuable outer frame 101, the aspiration holes 103 are arranged splittingly. The aspiration holes 103 are connected to the aspiration path 104. The rotation axis 106 to rotate the evacuable outer frame 101 is also arranged with the aspiration path 105, through which aspiration can be done. Meanwhile, the holes 103 are preferably provided with a porous filter (not shown).

Figure 7:
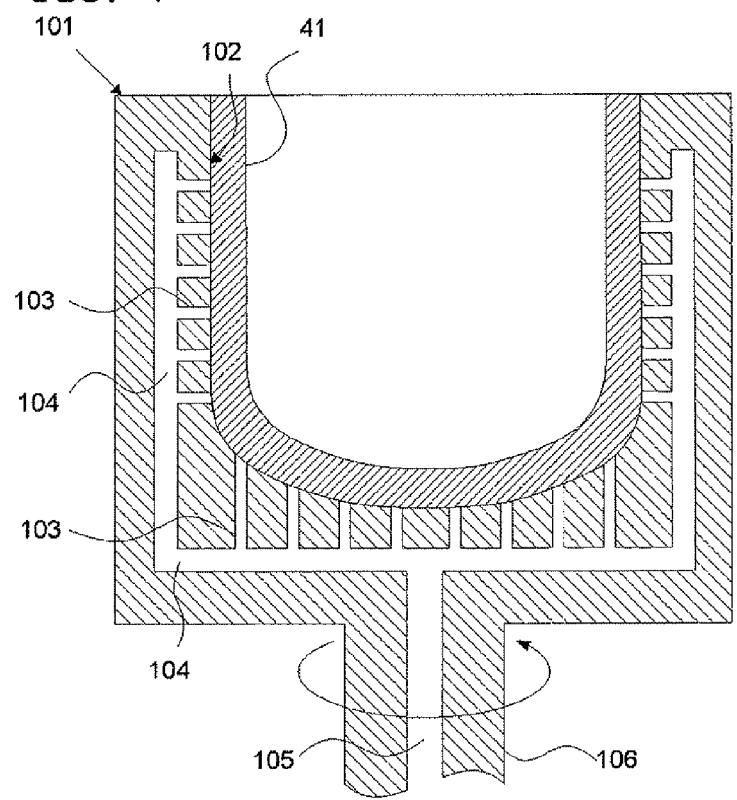
FIG. 7 is a schematic cross section view schematically showing one example of the step of forming the preliminarily molded substrate in the method for producing a silica container of the present invention.

The powdered substrate's raw material 11 is fed into the inner wall 102 of the evacuable outer frame 101 to preliminarily mold the powdered substrate's raw material 11 to a prescribed shape in accordance with the inner wall 102 of the evacuable outer frame 101, thereby giving the preliminarily molded substrate 41 (refer to FIG. 7).

Specifically, the powdered substrate's raw material 11 is fed gradually into the inner wall 102 of the evacuable outer frame 101 from a powdered raw material hopper (not shown) with rotating the evacuable outer frame 101 thereby molding to a shape of the container by utilizing a centrifugal force. Alternatively, thickness of the preliminarily molded substrate 41 may be controlled to the prescribed value by contacting a plate-like inner frame (not shown) to the rotating powders from inside.

A feeding method of the powdered substrate's raw material 11 into the evacuable outer frame 101 is not particularly limited; for example, a hopper equipped with an agitation screw and a measuring feeder may be used. In this case, the powdered substrate's raw material 11 filled in the hopper is fed with agitating by the agitation screw while controlling the feeding amount by the measuring feeder.

Then, as shown in FIG. 3 (3), the powdered inner-layer's raw material 12 is fed onto an inner surface of the preliminarily molded substrate 41 with rotating the evacuable outer frame 101 thereby forming the preliminarily molded inner layer 46 by preliminarily molding to the prescribed shape in accordance with the inner surface of the preliminarily molded substrate 41 (Step 3).

Figure 11:
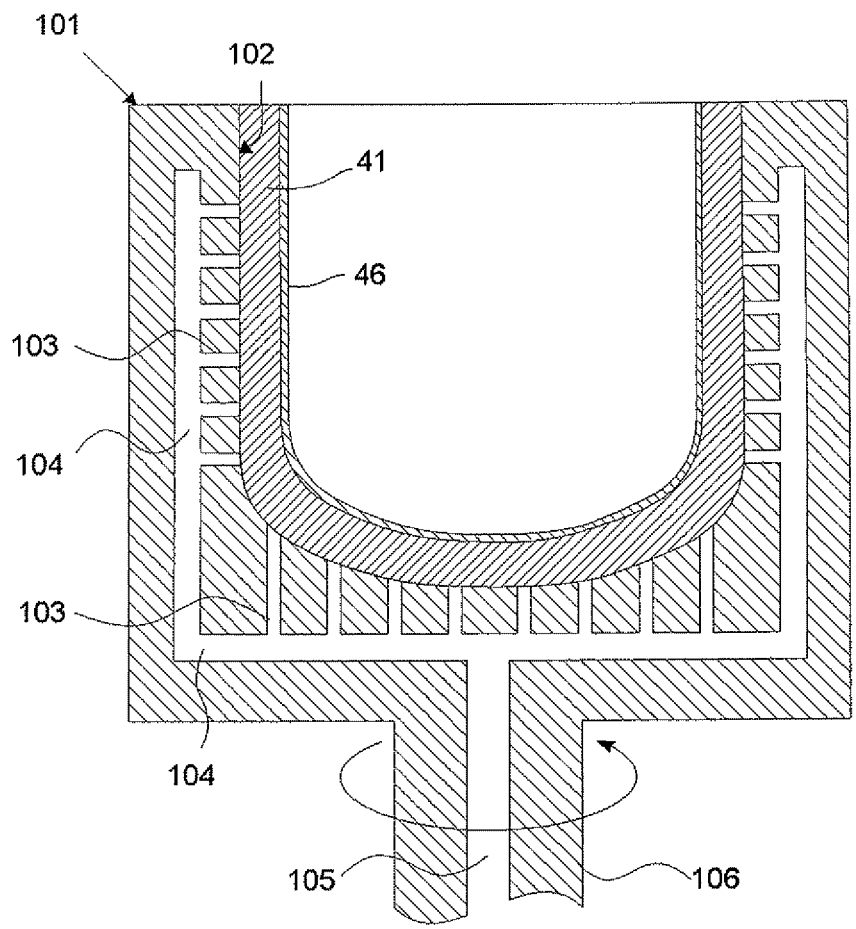
FIG. 11 is a schematic cross section view schematically showing one example of the step of forming the preliminarily molded inner layer on the inner surface of the preliminarily molded substrate in the method for producing a silica container of the present invention.

Basically, procedures similar to those in the case of feeding of the powdered substrate's raw material 11, as described above, are followed. Namely, the powdered inner-layer's raw material 12 is fed gradually onto the inner surface of the preliminarily molded substrate 41 from a powdered raw material hopper with rotating the evacuable outer frame 101 thereby molding to a shape of the container by utilizing a centrifugal force (refer to FIG. 11).

Then, as shown in FIG. 3 (4), the substrate 51 and the inner layer 56 are formed by a discharge-heating method under aspiration (Step 4).

Figure 12:
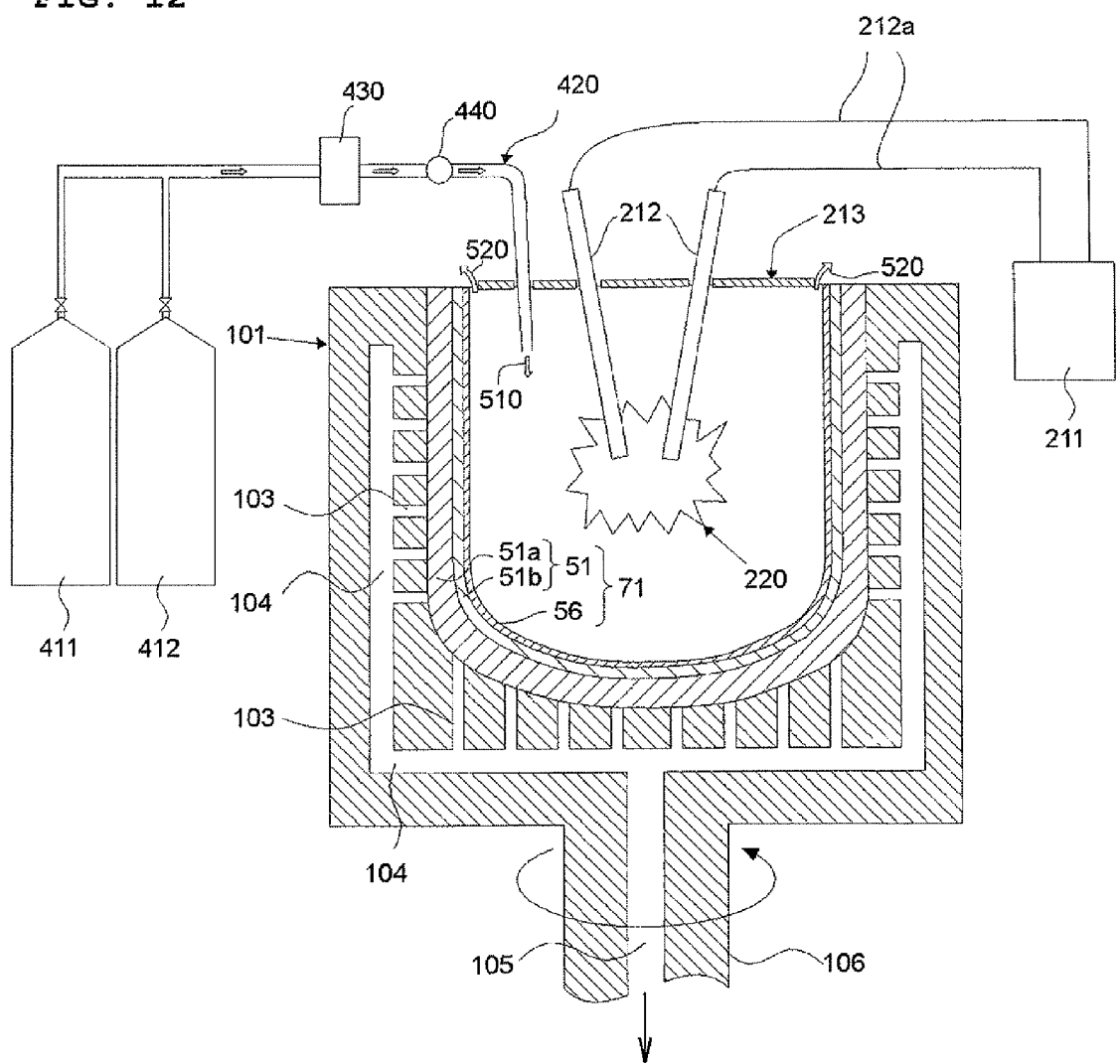
FIG. 12 is a schematic cross section view schematically showing one example of the step of discharge-heating of the preliminarily molded substrate and the preliminarily molded inner layer simultaneously in the method for producing a silica container of the present invention.

Specifically, as shown in FIG. 12, the preliminarily molded substrate 41 and the preliminarily molded inner layer 46 are degassed by aspiration from the peripheral side of the preliminarily molded substrate 41 through the aspiration holes 103 formed in the evacuable outer frame 101, with simultaneously heating from inside of the preliminarily molded substrate 41 and the preliminarily molded inner layer 46 by a discharge-heat melting method. With this, the substrate 51 and the inner layer 56, having a sintered body in the peripheral part of the preliminarily molded substrate 41 and a fused glass body in the inner part of the preliminarily molded substrate 41 and the preliminarily molded inner layer 46, are formed.

The equipment for forming the substrate 51 and the inner layer 56 is comprised of, in addition to the rotatable, evacuable outer frame 101 and having a rotational axis symmetry as mentioned above, the rotation motor (not shown), the carbon electrodes 212 which are the heat source of the discharge-heat melting (sometimes called arc melting or arc discharge melting), the electric wirings 212a, the high voltage electricity source unit 211, the cap 213, and so forth. In addition, structural components to control an atmospheric gas to be charged from inside the preliminarily molded inner layer 46, for example, the $O_2$ gas-supplying cylinder 411, the inert gas-supplying cylinder 412, the gas mixture-supplying pipe 420, the dehumidifying equipment 430, the dew-point temperature meter 440, and so forth, may be arranged.

The step of forming the substrate 51 and the inner layer 56 by a discharge-heat melting method may be conducted under an atmosphere of a mixture of an inert gas with 1 to 30% by volume of an oxygen gas. In this case, carbon particles from the carbon electrodes can be gasified to CO and $CO_2$ by oxidation so that a silica container containing few carbon (C) fine particles may be obtained.

The step may be conducted under an air atmosphere with setting a dew-point temperature in the range between 10 and −10° C. and with controlling the dew-point temperature within ±1° C. of the set temperature. In this case, amount of an OH group and amount of water ($H_2O$) contained in the silica container can be reduced in spite of low cost.

For example, melting and sintering of the preliminarily molded substrate 41 and the preliminarily molded inner layer 46 are conducted by the procedures as follows: at first, before start of the electricity charge between the carbon electrodes 212, charge of a gas mixture, comprised of an $O_2$ gas and an inert gas and made its dew-point temperature below the prescribed dew-point temperature by dehumidification, is started from inside the preliminarily molded substrate 41 and the preliminarily molded inner layer 46. Specifically, as shown in FIG. 12, an $O_2$ gas in the $O_2$ gas-supplying cylinder 411 and an inert gas (for example, nitrogen ($N_2$), argon (Ar), and helium (He)) in the inert gas-supplying cylinder 412 are mixed and charged from inside the preliminarily molded substrate 41 and the preliminarily molded inner layer 46 through the gas mixture-supplying pipe 420. Meanwhile, outlined arrows shown by the reference number 510 show the flow direction of the gas mixture.

The dew-point temperature can be set by an appropriate dehumidifying equipment and the like; and to measure the dew-point temperature, an appropriate dew-point temperature meter and the like can be used. In FIG. 12, an embodiment that the dehumidifying equipment 430 and the dew-point temperature meter 440 are integrated to the gas mixture-supplying pipe 420 is shown, but the embodiment is not limited to this; any embodiment enabling to make the dew-point temperature of the gas mixture within a prescribed range by dehumidification can be used.

At this time, a gas in the evacuable outer frame 101 is preferably ventilated simultaneously, as mentioned above. The ventilation can be done by escaping the atmospheric gas in the evacuable outer frame 101 to outside, for example, through a space in the cap 213. Meanwhile, outlined arrows shown by the reference number 520 show the flow direction of the atmospheric gas by ventilation.

Then, under the condition of controlling the atmosphere as mentioned above, a vacuum pump for degassing (not shown) is started thereby aspirating the preliminarily molded substrate 41 from its outer side through the aspiration holes 103 and the aspiration paths 104 and 105 and at the same time charging of electricity between the carbon electrodes 212 is started with rotating the evacuable outer frame 101, containing the preliminarily molded substrate 41 and the preliminarily molded inner layer 46, at a certain constant rate.

When the arc discharge between the carbon electrodes 212 is started (shown by the reference number 220), temperature of the inner surface part of the preliminarily molded substrate 41 and the preliminarily molded inner layer 46 reaches melting region of the powdered silica (estimated temperature of about 1800 to about 2000° C.) thereby melting is started from the most surface layer. When the most surface layer is melted, degree of vacuum by aspiration with the vacuum pump for degassing increases (pressure is dropped rapidly), whereby the change to a fused silica glass layer progresses from inside to outside with degassing a dissolved gas contained in the powdered substrate's raw material 11 and in the powdered inner-layer's raw material 12. The timing of aspiration is important; strong aspiration should not be made before the inner surface layer inside the container is changed to a glass. The reason for this resides in that, if strong aspiration is made from the beginning, impure fine particles contained in an atmospheric gas is adhered and accumulated onto the inner surface part of the preliminarily molded articles by a filtering effect. Accordingly, it is preferable that degree of vacuum be not so high at the beginning, and aspiration is intensified gradually as the inner surface changes to a melted glass.

Heating by electric charge and aspiration by the vacuum pump are continued until about half of the entire thickness of the inner layer and the substrate is melted from inside so that the inner layer 56 may be changed to a transparent silica glass, and the inner peripheral side 51b of the substrate may be changed to a part comprised of a transparent to semitransparent layer, while the outer peripheral part 51a (about half of outside remained) of the substrate 51 becomes a sintered, white and opaque silica (opaque layer). Degree of vacuum is preferably $10^4$ Pa or lower, or more preferably $10^3$ Pa or lower.

With this, the silica container 71 of the present invention, as shown in FIG. 2, can be made.

Meanwhile, the inner layer 56 may be made comprised of a plurality of transparent silica glass layers having different purities and additives by further conducting, once or a plurality of times, the step of the inner layer formation in the second embodiment, as described later.

Figure 4:
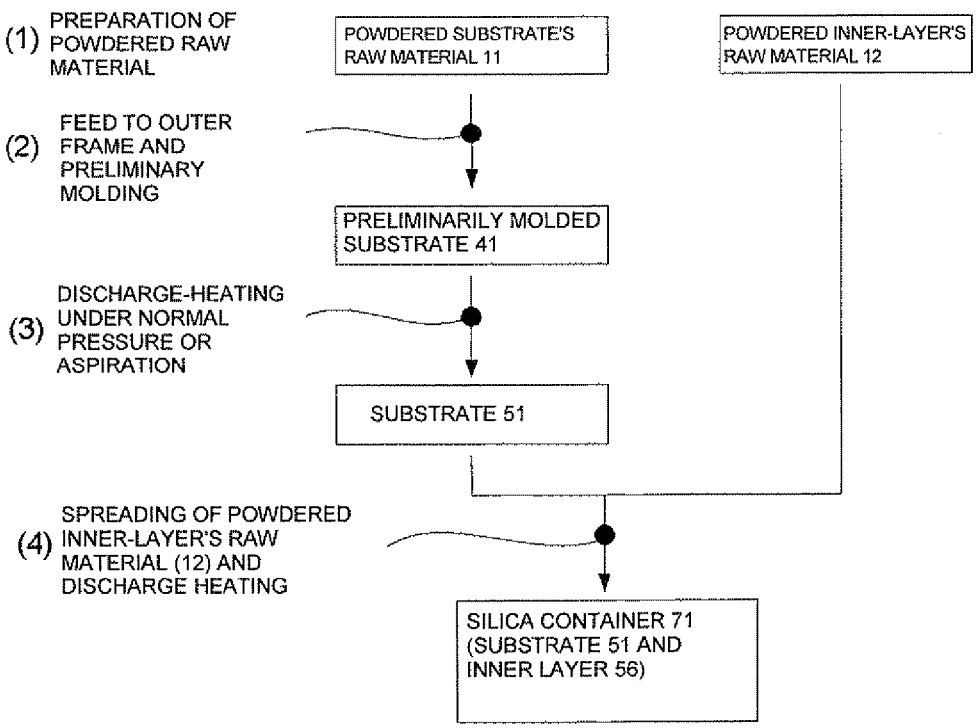
FIG. 4 is a flow chart showing outline of another example of the method for producing a silica container of the present invention.

In FIG. 4, an outline of another example (second embodiment) of the method for producing the silica container 71 according to the present invention is shown.

The method for producing the silica container 71 according to this embodiment is carried out basically by following the contents shown in Patent Documents 6 and 7. However, the powdered silica of the present invention produced by the method as mentioned above is used as the powdered raw material for forming the inner layer 56 (powdered inner-layer's raw material 12).

Firstly, as shown in FIG. 4 (1), the powdered substrate's raw material 11 and the powdered inner-layer's raw material 12, each being a powdered silica, are prepared (Step 1).

This step can be carried out in a manner similar to that of the first embodiment as mentioned above.

Then, as shown in FIG. 4 (2), the powdered substrate's raw material 11 is fed to the outer frame having a rotational symmetry for molding (refer to FIG. 7) (Step 2).

This step also can be carried out in a manner similar to that of the first embodiment as mentioned above. However, in such a case that discharge-heating under aspiration is not necessary, the outer frame 101', such as the one shown in FIG. 6, may be used instead of the evacuable outer frame 101 shown in FIG. 5. This outer frame 101' is made of, for example, such as graphite, and has a rotational symmetry. The rotation axis 106' to rotate the outer frame 101' is arranged; but holes and the like are not particularly arranged on the inner wall 102'.

Then, as shown in FIG. 4 (3), the substrate 51 is formed by a discharge-heat melting method under aspiration (Step 3).

Figure 8:
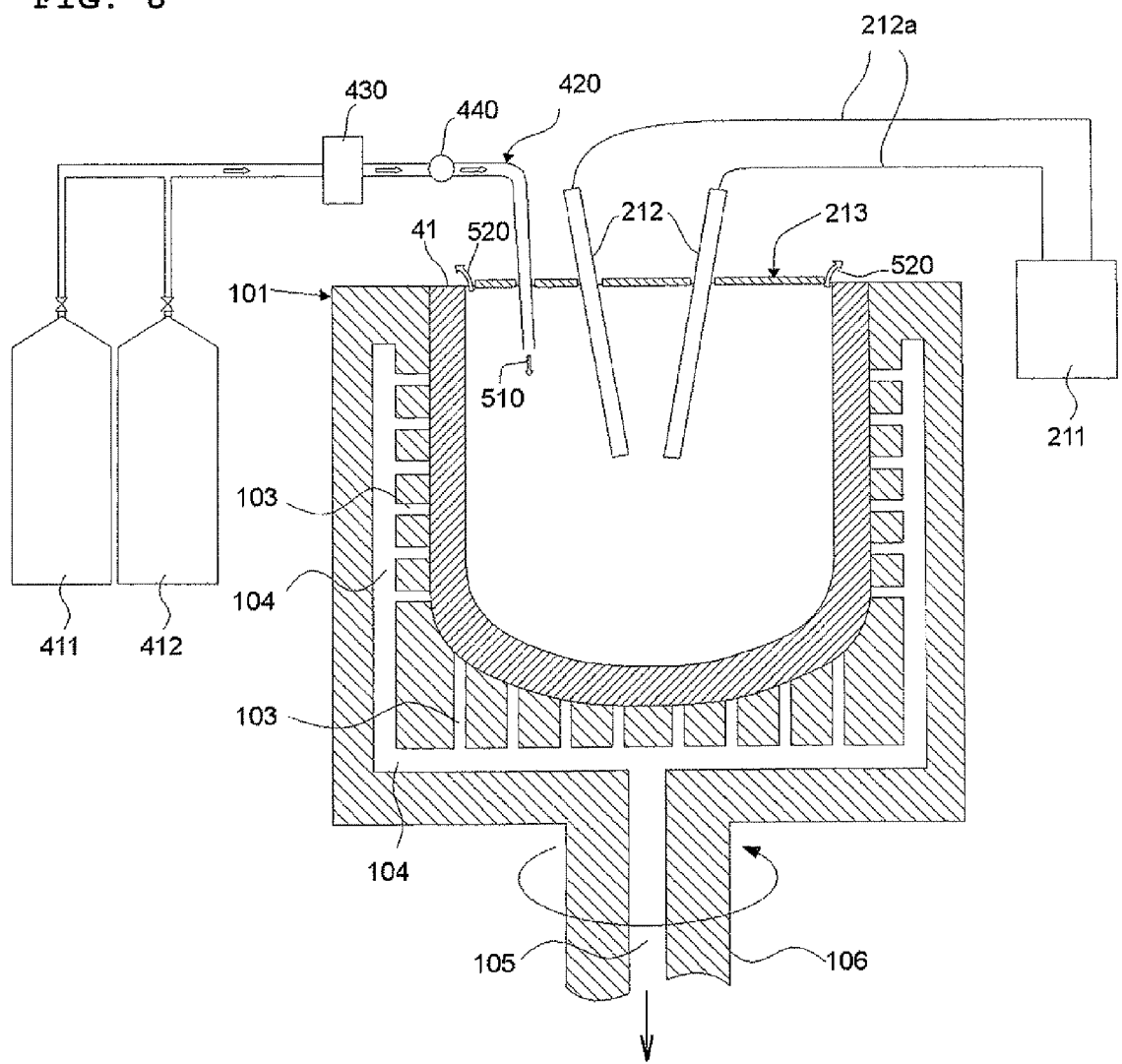
FIG. 8 is a schematic cross section view schematically showing a part of one example of the step of forming the substrate (before discharge-heat melting) in the method for producing a silica container of the present invention.
Figure 9:
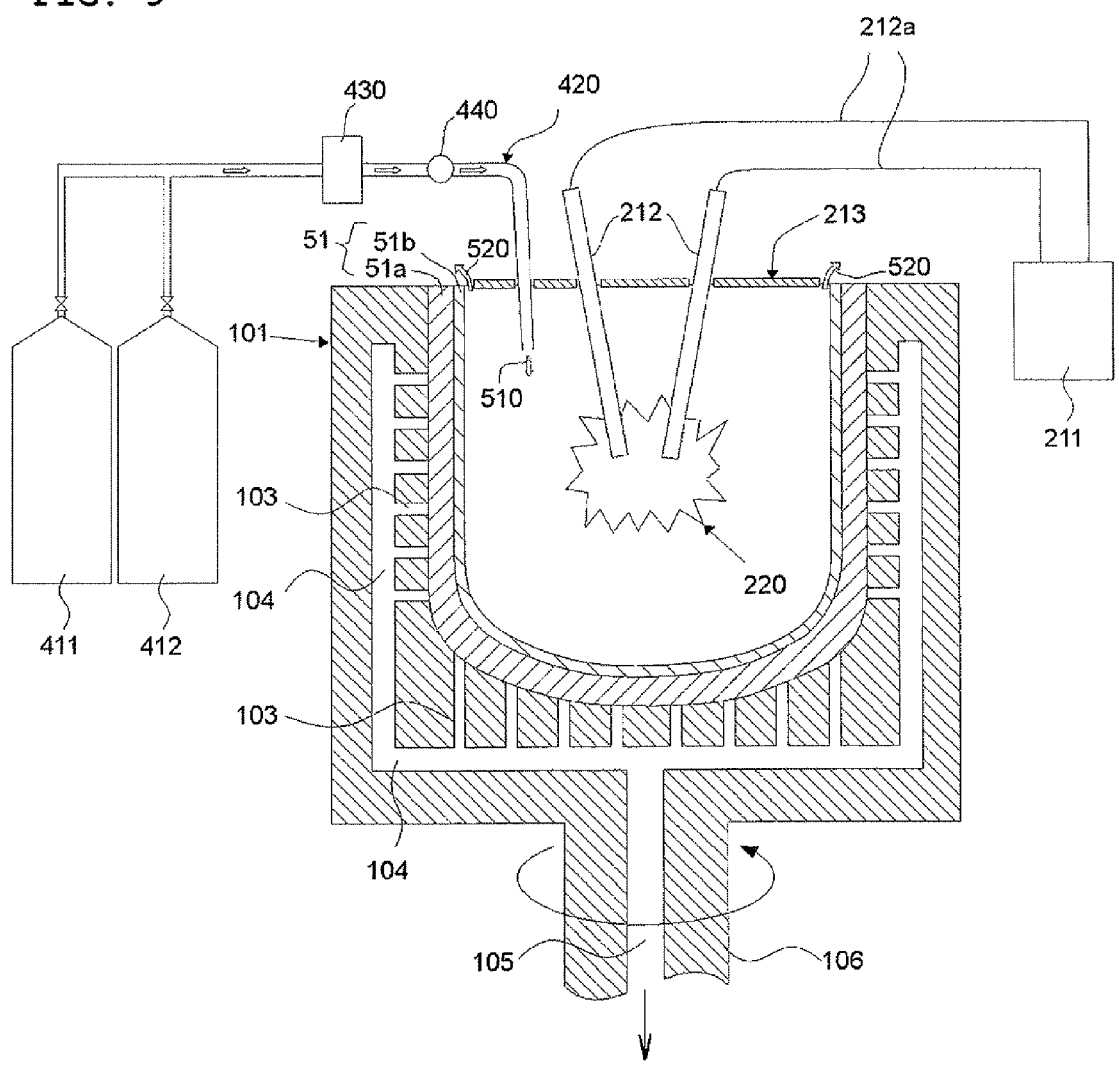
FIG. 9 is a schematic cross section view schematically showing a part of one example of the step of forming the substrate (during discharge-heat melting) in the method for producing a silica container of the present invention.

Specifically, as shown in FIG. 8 and FIG. 9, the preliminarily molded substrate 41 is degassed by aspiration from the outer peripheral side of the preliminarily molded substrate 41 through the aspiration holes 103 formed in the evacuable outer frame 101, with simultaneously heating from inside of the preliminarily molded substrate by a discharge-heat melting method. With this, the substrate 51, having the outer peripheral part of the preliminarily molded substrate 41 made a sintered body and having the inner part of the preliminarily molded substrate 41 made a fused glass body, is formed.

Figure 6:
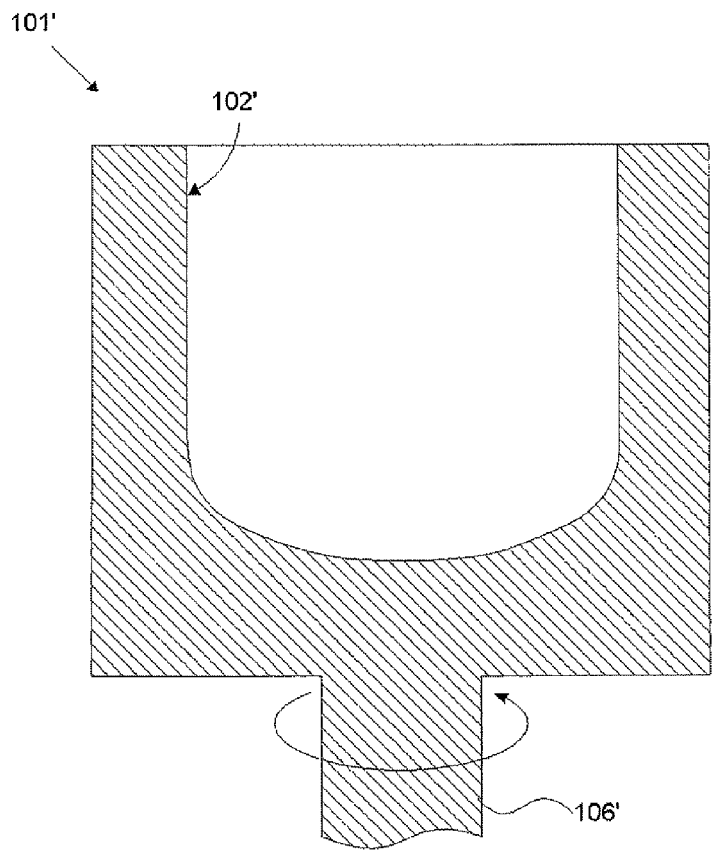
FIG. 6 is a schematic cross section view showing another example of the outer frame usable in the method for producing a silica container of the present invention.

On the other hand, as shown in FIG. 6, in the case that the outer frame 101' not especially conducting aspiration is used, the substrate 51 is formed by heating at high temperature from inside the preliminarily molded substrate 41 by a discharge-heat melting method without aspiration especially.

Hereinbelow, the embodiment that the substrate 51 is formed by using the evacuable outer frame 101 under aspiration will be explained mainly; but in the case of under normal pressure, not conducting aspiration, the substrate 51 can be formed similarly, except for conducting aspiration.

The equipment for forming the substrate 51 is comprised of, as shown in FIG. 8 and FIG. 9, in addition to the foregoing rotatable, evacuable outer frame 101 (or may be the outer frame 101') having a rotational axis symmetry, the rotation motor (not shown), the carbon electrodes 212 which are the heat source of the discharge-heat melting (sometimes called arc melting or arc discharge melting), the electric wirings 212a, the high voltage electricity source unit 211, the cap 213, and so forth. In addition, structural components to control an atmospheric gas to be charged from inside the preliminarily molded substrate, for example, the $O_2$ gas-supplying cylinder 411, the inert gas-supplying cylinder 412, the gas mixture-supplying pipe 420, the dehumidifying equipment 430, the dew-point temperature meter 440, and so forth, may be arranged.

The step of forming the substrate 51 by a discharge-heat melting method may be conducted under an atmosphere of a mixture of an inert gas with 1 to 30% by volume of an oxygen gas. In this case, carbon particles from the carbon electrodes can be gasified to $CO$ and $CO_2$ by oxidation so that a silica container containing few carbon (C) fine particles may be obtained.

The step may be conducted under an air atmosphere with setting a dew-point temperature in the range between 10 and −10° C. and with controlling the dew-point temperature within ±1° C. of the set temperature. In this case, amount of an OH group and amount of water ($H_2O$) contained in the silica container can be reduced in spite of low cost.

For example, melting and sintering of the preliminarily molded substrate 41 are conducted by the procedures as follows: at first, before start of the electricity charge between the carbon electrodes 212, charge of a gas mixture, comprised of an $O_2$ gas and an inert gas and made the dew-point temperature below the prescribed dew-point temperature by dehumidification, is started from inside the preliminarily molded substrate 41. Specifically, as shown in FIG. 8, an $O_2$ gas in the $O_2$ gas-supplying cylinder 411 and an inert gas (for example, nitrogen ($N_2$), argon (Ar), and helium (He)) in the inert gas-supplying cylinder 412 are mixed and charged from inside the preliminarily molded substrate 41 through the gas mixture-supplying pipe 420. Meanwhile, outlined arrows shown by the reference number 510 show the flow direction of the gas mixture.

The dew-point temperature can be set by an appropriate dehumidifying equipment and the like; and to measure the dew-point temperature, an appropriate dew-point temperature meter and the like can be used. In FIG. 8 and FIG. 9, an embodiment that the dehumidifying equipment 430 and the dew-point temperature meter 440 are integrated to the gas mixture-supplying pipe 420 is shown, but the embodiment is not limited to this; any embodiment enabling to make the dew-point temperature of the gas mixture within a prescribed range by dehumidification can be used.

At this time, a gas in the evacuable outer frame 101 is preferably ventilated simultaneously, as mentioned above. The ventilation can be done by escaping the atmospheric gas in the evacuable outer frame 101 to outside, for example, through a space in the cap 213. Meanwhile, outlined arrows shown by the reference number 520 show the flow direction of the atmospheric gas by ventilation.

Then, under the condition of controlling the atmosphere as mentioned above, a vacuum pump for degassing (not shown) is started thereby aspirating the preliminarily molded substrate 41 from its outer side through the aspiration holes 103 and the aspiration paths 104 and 105 and at the same time charging of electricity between the carbon electrodes 212 is started with rotating the evacuable outer frame 101, containing the preliminarily molded substrate 41, at a certain constant rate.

When the arc discharge between the carbon electrodes 212 is started (shown by the reference number 220), temperature of the inner surface part of the preliminarily molded substrate 41 reaches melting region of the powdered silica (estimated temperature of about 1800 to about 2000° C.) thereby melting is started from the most surface layer. When the most surface layer is melted, degree of vacuum by aspiration with the vacuum pump for degassing increases (pressure is dropped rapidly), whereby the change to a fused silica glass layer progresses from inside to outside with degassing a dissolved gas contained in the powdered substrate's raw material 11. The timing of aspiration is important; strong aspiration should not be made before the inner surface layer inside the container is changed to a glass. The reason for this resides in that, if strong aspiration is made from the beginning, impure fine particles contained in an atmospheric gas is adhered and accumulated onto the inner surface part of the preliminarily molded articles by a filtering effect. Accordingly, it is preferable that degree of vacuum be not so high at the beginning, and aspiration is intensified gradually as the inner surface changes to a melted glass.

Heating by electric charge and aspiration by the vacuum pump are continued until about half of the entire thickness of the substrate is melted from inside so that the inner peripheral side 51b of the substrate may be changed to a part comprised of a transparent to semitransparent layer, while the outer peripheral part 51a (about half of outside remained) of the substrate 51 may become a sintered, white and opaque silica (opaque layer). Degree of vacuum is made preferably $10^4$ Pa or lower, or more preferably $10^3$ Pa or lower.

Then, as shown in FIG. 4 (4), the inner layer 56 is formed on an inner surface of the substrate 51 with heating at high temperature from its inside by a discharge-heat melting method, while a powdered silica for forming the inner layer (the powdered inner-layer's raw material 12) is spread from inside of the substrate 51 (Step 4).

Meanwhile, the inner layer 56 may be made comprised of a plurality of transparent silica glass layers having different purities and additives by repeating Step 4.

The method for forming the inner layer 56 will be explained with referring to FIG. 10.

Similarly to the previous step, the equipment for forming the inner layer 56 on the inner surface of the substrate 51 is comprised of, in addition to the rotatable, evacuable outer frame 101 arranged with the substrate 51 having a rotational axis symmetry, the rotation motor (not shown), the powdered raw material's hopper 303 containing the powdered inner-layer's raw material 12 for forming the inner layer 56, the agitation screw 304, the measuring feeder 305, the carbon electrodes 212 which are the heat source of the discharge-heat melting, the electric wirings 212a, the high voltage electricity source unit 211, the cap 213, and so forth. Similarly to Step 3, in the case that the atmospheric gas is controlled, the $O_2$ gas-supplying cylinder 411, the inert gas-supplying cylinder 412, the gas mixture-supplying pipe 420, the dehumidifying equipment 430, the dew-point temperature meter 440, and so forth, may be arranged further.

The inner layer 56 is formed as follows: firstly, the evacuable outer frame 101 is set at the prescribed rotation speed, and then high voltage is loaded gradually from the high voltage electricity source unit 211 and at the same time the powdered inner-layer's raw material 12 for forming the inner layer 56 (high purity powdered silica) is spread gradually from top of the substrate 51 from the raw material's hopper 303. At this time, the electric discharge has been started between the carbon electrodes 212 so that inside the substrate 51 is in the temperature range of melting of the powdered silica (estimated temperature of about 1800 to about 2000° C.); and with this, the spread powdered inner-layer's raw material 12 becomes to melted silica particles thereby attaching to the inner surface of the substrate 51. A mechanism is employed such that the carbon electrodes 212 arranged in the upper opening site of the substrate 51, a feeding port of the powdered raw material, and the cap 213 may change their positions relative to the substrate 51 to a certain degree; and by changing these positions, the inner layer 56 can be formed on the entire inner surface of the substrate 51 with a uniform thickness.

The step of forming the inner layer 56 by a discharge-heat melting method may also be conducted under an atmosphere of a mixed gas of an inert gas with 1 to 30% by volume of an oxygen gas. The step may also be conducted under an air atmosphere with setting a dew-point temperature in the range between 10 and −10° C. and with controlling the temperature within ±1° C. of the set dew-point temperature.

Figure 10:
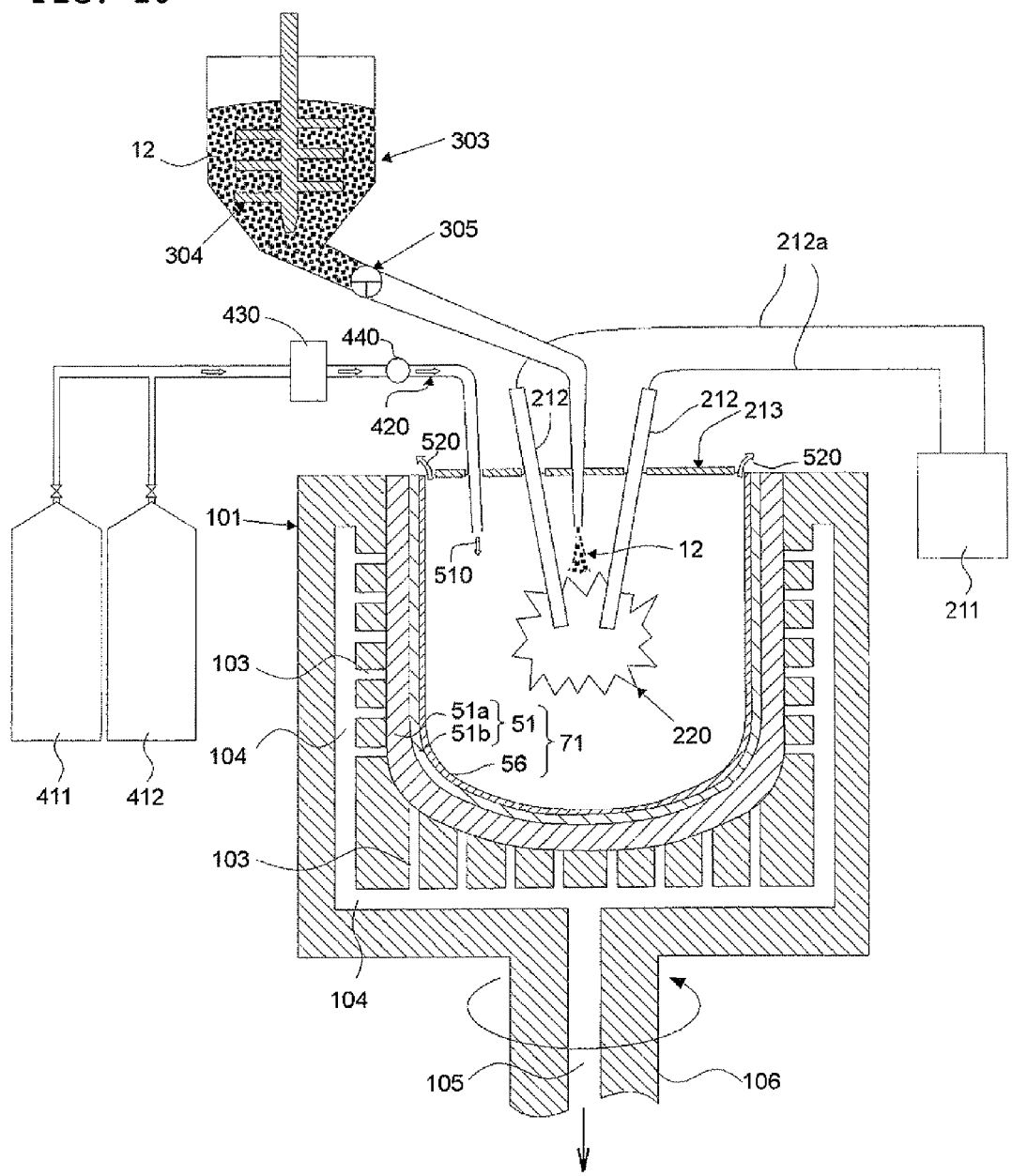
FIG. 10 is a schematic cross section view schematically showing one example of the step of forming the inner layer in the method for producing a silica container of the present invention.

Specifically, as shown in FIG. 10, an $O_2$ gas in the $O_2$ gas-supplying cylinder 411 and an inert gas (for example, nitrogen, argon, and helium) in the inert gas-supplying cylinder 412 can be mixed and charged from inside the substrate 51 through the gas mixture-supplying pipe 420. Meanwhile, outlined arrows shown by the reference number 510 show the flow direction of the gas mixture. At this time, the gases in the evacuable outer frame 101 can be ventilated simultaneously, as mentioned above. The ventilation can be done, for example, by escaping the gases of the atmosphere inside the evacuable outer frame 101 to outside through a space in the cap 213. Meanwhile, outlined arrows shown by the reference number 520 show the flow direction of the gas mixture by ventilation.

According to the way as described above, the silica container 71 of the present invention can be obtained; and the silica container is cleaned as follows when it is necessary.

[Cleaning and Drying of the Silica Container]

The silica container is obtained by etching its surface by, for example, an aqueous solution of hydrogen fluoride (HF) with the concentration of about 1 to about 10% and the time for 5 to 30 minutes; thereafter by washing with pure water, and then by drying in a clean air.

By conducting the foregoing steps, the silica container 71 according to the present invention as mentioned above and shown in FIG. 2 can be produced.

EXAMPLES

Hereinbelow, the present invention will be explained more specifically by showing Examples and Comparative Examples of the present invention; but the present invention is not limited to them.

Example 1

According to the method for producing a powdered silica and the method for producing a silica container according to the present invention shown in FIG. 3, the powdered silica was produced and then the silica container was produced, as described below.

Firstly, a powdered natural quartz having purity of 99.999% by weight and particle diameter of 50 to 500 μm was prepared as the powdered substrate's raw material 11; and a powdered natural quartz having particle diameter of 50 to 500 μm, doped with 200 ppm by weight of Ba, and containing $2 \times 10^{17}$ molecules/g of $H_2$ was prepared as the powdered inner-layer's raw material 12.

Here, the powdered inner-layer's raw material 12 as the powdered raw material for making an inner layer of the silica container was produced via steps as shown in FIG. 1. Specifically, at first, a high purity powdered natural quartz having purity of 99.9999% by weight was prepared. Then, the high purity powdered natural quartz thus prepared was soaked in 25% by volume of aqueous ethyl alcohol containing barium nitrate $Ba(NO_3)_2$, and then dried. Then, this quartz powders were charged into a vacuum furnace with a stainless steel jacket, the inside atmosphere was displaced with 100% by volume of a hydrogen gas, and then heating was conducted at 400° C. for 3 hours with keeping the pressure at 1 kgf/cm² (almost as same as the atmospheric pressure). Thereafter, it was cooled to room temperature (25° C.) with keeping the hydrogen gas atmosphere as it was to obtain the powdered inner-layer's raw material 12.

Then, the powdered substrate's raw material and the powdered inner-layer's raw material were preliminarily molded in an outer frame by integral molding as follows. Firstly, the powdered substrate's raw material 11 was fed to the inner wall 102 of the rotating, evacuable outer frame 101, which is made of graphite with a column-like shape and has the aspiration holes 103 formed in the inner wall 102, with the thickness being controlled at a prescribed value; and then the powdered inner-layer's raw material 12 was fed to form the preliminarily molded inner layer 46 on the inner surface layer of the preliminarily molded substrate 41.

Then, both the preliminarily molded substrate 41 and the preliminarily molded inner layer 46 were sintered and fused by a discharge-heat melting method using carbon electrodes (arc discharge heating method) under an air atmosphere controlled within ±1° C. of the dew-point temperature 7° C., namely between 6° C. and 8° C., with degassing by aspiration from outside of the outer frame by using a vacuum pump.

The silica container 71 thus obtained was washed with 3% by weight of an aqueous solution of hydrogen fluoride (HF) at 25° C. for 3 minutes, rinsed with pure water, and then dried.

Example 2

The silica container 71 was produced in a manner similar to that of Example 1, except that the powdered inner-layer's raw material 12 doped with 500 ppm by weight of Ba was used and the heat-treatment was carried out at 400° C. under 100% by volume of a hydrogen gas with the pressure of 9.9 kgf/cm² (about 9.9 atmospheres) for 3 hours to dope $2 \times 10^{18}$ molecules/g of $H_2$.

Example 3

The silica container 71 was produced according to the method for producing a silica container shown in FIG. 4 (second embodiment).

Here, the powdered substrate's raw material 11 and the powdered inner-layer's raw material 12 were prepared in manners similar to those of Example 1.

Sintering and fusing of the substrate 51 were done by the arc-discharge heating method under normal pressure with an air controlled within ±1° C. of the dew-point temperature 7° C., and then the inner layer 56 was formed by the arc-discharge heating method under normal pressure with an air controlled within ±1° C. of the dew-point temperature 7° C. with spreading the powdered inner-layer's raw material 12 from top of the outer frame 101.

Example 4

The silica container 71 was produced according to the method for producing a silica container shown in FIG. 4.

However, the powdered substrate's raw material 11 and the powdered inner-layer's raw material 12 were prepared in manners similar to those of Example 2.

Example 5

In a manner almost similar to that of Example 3, the silica container was produced. However, the powdered substrate's raw material 11 was doped with 50 ppm by weight of Al, and the powdered inner-layer's raw material 12 was doped with Al in addition to Ba and $H_2$. The heating atmospheres during formation of the substrate 51 and the inner layer 56 were made within ±1° C. of the dew-point temperature 3° C.

Example 6

The silica container 71 was produced in a manner similar to that of example 5, except that the substrate 51 and the inner layer 56 were formed with evacuating by aspirating the preliminarily molded articles contained in the outer frame from each outside.

Example 7

The silica container 71 was produced in a manner similar to that of Example 5, except that the doping amount of Ba in the powdered inner-layer's raw material 12 was made smaller, 120 ppm by weight. The doping amount of $H_2$ was made $4 \times 10^{17}$ molecules/g.

Example 8

The silica container 71 was produced in a manner similar to that of Example 5, except that the powdered inner-layer's raw material 12 was doped with 100 ppm by weight of Ba, 20 ppm by weight of Sr, and $4 \times 10^{17}$ molecules/g of $H_2$.

Comparative Example 1

According to mostly a conventional method, a silica container (a silica crucible) was prepared. Namely, a high purity powdered quartz having particle diameter of 50 to 500 μm and purity of 99.9999% by weight was used as both the powdered substrate's raw material and the powdered inner-layer's raw material. The substrate was formed by the arc-discharge heating method under normal pressure in an air without particular humidity control, and the inner layer was formed by melting with the arc-discharge heating method under normal pressure in the same air as the foregoing, with spreading the powdered raw material from upper part of the outer frame.

Comparative Example 2

The silica container was produced in a manner similar to that of Comparative Example 1, except that the powdered inner-layer's raw material was doped with 500 ppm by weight of Ba.

Comparative Example 3

The silica container was produced in a manner similar to that of Comparative Example 1, except that the powdered inner-layer's raw material doped with 30 ppm by weight of Ba was used and the heat-treatment was carried out at 400° C. under a gas mixture of 10% by volume of a hydrogen gas and 90% by volume of nitrogen gas with the pressure of 1 kgf/cm² (about 1 atm) for 3 hours to dope $2 \times 10^{16}$ molecules/g of $H_2$.

Comparative Example 4

The silica container was produced in a manner similar to that of Comparative Example 1, except that a low-purity powdered substrate's raw material with the purity of 99.99% by weight was used.

Comparative Example 5

The silica container was produced in a manner similar to that of Example 1, except that the powdered inner-layer's raw material without addition of hydrogen molecules was used.

Comparative Example 6

The silica container was produced in a manner similar to that of Example 1, except that the powdered inner-layer's raw material without addition of Ba was used.

[Evaluation Methods in Examples and Comparative Examples]

In each Example and Comparative Example, measurements of physical properties and property evaluation as to the powdered raw material and gases used and the silica container produced, were carried out as follows.

[Method for Measuring Particle Diameter of Each Powdered Raw Material]

Two-dimensional shape observation and area measurement of each powdered raw material were carried out with an optical microscope or an electron microscope. Then, the diameter was obtained by calculation of the obtained area value with the assumption that shape of the particle is a true circle. This technique was repeated statistically to obtain the range of particle diameter (99% or more by weight of particles are included in this range).

[Measurement of the Dew-Point Temperature]

Measurement was done with a dew-point temperature meter.

Meanwhile, the measurement in each Example was done by the dew-point temperature meter 440 arranged in the gas mixture-supplying pipe 420, as mentioned above.

[Analysis of the Impure Metal Element Concentration]

When an impure metal element concentration is relatively low (i.e., the glass is of high purity), ICP-AES (Inductively Coupled Plasma-Atomic Emission Spectroscopy) or ICP-MS (Inductively Coupled Plasma-Mass Spectroscopy) was used, and when an impure metal element concentration is relatively high (i.e., the glass is of low purity), AAS (Atomic Absorption Spectroscopy) was used.

[Thickness Measurement of Each Layer]

The container cross section at the half point of total height of the side wall of the silica container (corresponding to the height of 200 mm) was measured by a scale to obtain thickness of the substrate and the inner layer.

[Measurement of OH Group Concentration]

Each sample was obtained by cutting out a transparent part of the substrate and the inner layer, respectively, and then polishing it. The measurement was done for each sample with an infrared absorption spectroscopy. Conversion to the OH group concentration was done according to the following literature: Dodd, D. M. and Fraser, D. B., (1966), "Optical determination of OH in fused silica", Journal of Applied Physics, vol. 37, p. 3911.

[Measurement of Release Amount of a Hydrogen Gas]

Measurement of the release amount from the powdered inner-layer's raw material (powdered silica raw material) was made on the powders as it is; measurement of release amount of a hydrogen gas from the inner layer of the silica container was made on a granular sample of the silica glass with the particle diameter controlled in the range from 100 μm to 1 mm.

The gas amount released from the powdered inner-layer's raw material or from the sample upon heating at 1000° C. under vacuum was measured by a mass spectrometry instrument. Details of the measurement were according to the following literature. The amount was expressed by the released molecules per unit mass (hydrogen molecules/glass gram) with the assumption that all of $H_2$ molecules contained therein were released.

Nasu, S., et al., (1990), "Gas release of various kinds of vitreous silica", Journal of Illuminating Engineering Institute of Japan, vol. 74, No. 9, pp 595 to 600.

It was confirmed that the same value as the release amount of a hydrogen gas by the foregoing measurement method could also be obtained as the concentration of a hydrogen gas dissolved in the silica glass measured according to the measurement method in the following literature by using a polished sample having a cubic form with each line length being 5 mm.

V. S. Khotimchenko, et al., (1987), "Determining the content of hydrogen dissolved in quartz glass using the methods of Raman scattering and mass spectrometry", Journal of Applied Spectroscopy, Vol. 46, No. 6, pp 632-635.

[Measurement of Light Transmittance]

A glass sample with the size of about 5×5 mm (thickness of about 11 mm) was cut out from the inner layer to obtain an optically polished sample having 10-mm thickness, finished with parallel edges. Then, the linear light transmittance (the value called optical transmission, obtained by subtracting reflection at the sample surface, back-side reflection of inside the sample, and absorption of the sample itself from the incident light which is taken as 100%) of this glass sample was measured at a wavelength of 600 nm by using a visible light transmittance measurement instrument having a mercury lamp as its light source. The value reflects amount of gaseous bubbles and uniform solubility of a doped element in the sample.

[Evaluation of Continuous Pulling Up of a Silicon Single Crystal (Multipulling)]

A metal polysilicon with purity of 99.999999% by weight was fed into a produced silica container; thereafter, the temperature was raised to form a silicon melt, and then pulling up of a single crystal silicon was repeated for three times (multipulling). The evaluation was made as the success rate of single crystal growth. The pulling up conditions were: atmosphere of a 100% argon (Ar) gas with the pressure inside the CZ equipment being $10^3$ Pa, the pulling up rate of 1 mm/minute, rotation rate of 10 rpm, and the size of the silicon single crystal being 150 mm in diameter and 150 mm in length. Operation time for one batch was set at about 12 hours. Classification of evaluation based on the success rate of single crystal growth for repetition of three times was made as follows:

| | |
|---|---|
| success of three times: | good |
| success of two times: | fair |
| success of one time: | poor |

[Evaluation of Voids and Pinholes]

In the foregoing multipulling of the silicon single crystal, 10 sheets of each silicon wafer having the size of 150 mm diameter and 200 μm thickness and polished on the both sides were prepared from an arbitrary portion of the second silicon single crystal after multipulling of each silicon single crystal. Then, voids and pinholes present on both sides of each silicon wafer were counted; average void numbers and pinhole numbers per unit area ($m^2$) were obtained by a statistic numerical treatment.

average number of voids and pinholes is less than $1/m^2$: good average number of voids and pinholes is in the range from 1 to $2/m^2$: fair average number of voids and pinholes is $3/m^2$ or more: poor

[Evaluation of Etching Resistance of the Silica Container]

A sample was cut out from the side wall of the silica container after three multipullings of a silicon single crystal, in the part lower than the level of the silicon melt. The sample was made for the size of the inner wall surface of the silica container to be set to 100 mm×100 mm with full thickness in the thickness direction. Then, the etched amount in the inner wall of the inner layer was obtained by measuring the sample's cross section by a scale.

etched thickness of inner layer is less than 3 mm: good etched thickness of inner layer is in the range from 3 mm to less than 5 mm: fair etched thickness of inner layer is 5 mm or more: poor

[Prevention Effect of Impurity Diffusion to Inner Surface of the Silica Container]

A sample, having the size of 100 mm×100 mm and thickness of 15 mm (full thickness), was cut out, from the side wall of the silica container after three multipullings of a silicon single crystal, in the part above the level of silicon melt of the silica container. Then, a layer of 100 μm thickness from the inner surface part was removed by washing with an aqueous solution of hydrogen fluoride (HF). Then, a layer of 100 μm thickness from the inner surface part after washing was etched by a 50% aqueous solution of hydrogen fluoride (HF); and the evaluation was made on whether diffusion of an impure metal element from a substrate having a low silica purity to an inner layer having a high purity was large or small by analyzing the alkaline metal element concentration in the solution after the etching.

Classification based on the total concentration of Li, Na, and K in the 100 μm thickness portion from the inner surface was made as follows:

less than 0.1 ppm by weight: good 0.1 or more ppm by weight to less than 1 ppm by weight: fair 1 or more ppm by weight: poor

[Evaluation of (Relative) Production Cost of the Silica Container]

The production cost of the silica container was evaluated. In particular, costs associated with silica raw materials, a melting energy, and the like were summed up for the relative evaluation. The cost by a conventional method was based on Comparative Example 1.

low cost (less than 50% relative to cost of the conventional method): good moderate cost (50 to less than 100% relative to cost of the conventional method): fair high cost (cost of the conventional method was taken as 100%): poor Production conditions, measured physical properties, and evaluation results of each silica container produced in Examples 1 to 8 and Comparative Examples 1 to 6 are summarized in the following Tables 1 to 7.

TABLE 1

| Example No. | | Example 1 | Example 2 |
|---|---|---|---|
| Powdered substrate's raw material | | Powdered natural silica<br>Particle diameter: 50 to 500 μm<br>Purity: 99.999% by weight | Powdered natural silica<br>Particle diameter: 50 to 500 μm<br>Purity: 99.999% by weight |
| Powdered inner-layer's raw material | Powdered base material. | Powdered natural silica<br>Particle diameter: 50 to 500 μm<br>Purity: 99.9999% by weight | Powdered natural silica<br>Particle diameter: 50 to 500 μm<br>Purity: 99.9999% by weight |
| | Doping of alkaline earth metal element | Ba: 200 ppm by weight | Ba: 500 ppm by weight |
| | Doping of hydrogen molecules | $H_2$: 100% by volume, 1 atm, 400° C.<br>Doping amount: $2 \times 10^{17}$ molecules/g | $H_2$: 100% by volume, 9.9 atms, 400° C.<br>Doping amount: $2 \times 10^{18}$ molecules/g |
| Order of preliminary molding and heating of each layer | | Preliminary molding of substrae and inner layer, followed by simultaneous heating | Preliminary molding of substrate and inner layer, followed by simultaneous heating |

TABLE 1-continued

| Example No. | | Example 1 | Example 2 |
|---|---|---|---|
| Preiminary molding of substrate | | Rotation molding within frame | Rotation molding within frame |
| Preliminary molding of inner layer | | Rotation molding within frame | Rotation molding within frame |
| Melting and sintering method of substrate | | Arc discharge heating under aspiration | Arc discharge heating under aspiration |
| Atmosphere during melting and sintering of substrate | | Air, dew point: 7° C. | Air, dew point: 7° C. |
| Melting method of inner layer | | Arc discharge melting under aspiration | Arc discharge melting under aspiration |
| Atmosphere of inner layer melting | | Air, dew point: 7° C. | Air, dew point: 7° C. |
| Physical properties of substrate | Outer diameter/height/thickness (mm) | Outer diameter 450/height 400/thickness 10 | Outer diameter 450/height 400/thickness 10 |
| | Color tone | White opaque (outside) to colorless transparent (inside) | White opaque (outside) to colorless transparent (inside) |
| | OH group concentration (ppm by weight) | 10 | 10 |
| | Al Concentration (ppm by weight) | 3 | 3 |
| Physical properties of inner layer | Thickness (mm) | 5 | 5 |
| | Color tone | Colorless and transparent | Colorless and transparent |
| | OH group concentration (ppm by weight) | 30 | 25 |
| | Al Concentration (ppm by weight) | 3 | 3 |
| | Cocentration of alkaline earth metal element (ppm by weight) | Ba: 180 | Ba: 470 |
| | Alkaline metal concentration (ppb by weight) | Li: 10, Na: 60, K: 20 | Li: 10, Na: 60, K: 20 |
| | Release amount of hydrogen molecules (molecules/g) | $<1 \times 10^{16}$ | $<1 \times 10^{16}$ |
| | Light transmittance at 600 nm (%) | 92.6 | 92.4 |
| Evaluation | Single crystal multipulling | Good | Good |
| | Void/pinhole of single crystal | Fair | Good |
| | Container etching resistance | Fair | Good |
| | Impurity diffusion from container | Fair | Good |
| | Production cost of container | Fair | Fair |

TABLE 2

| Example No. | | Example 3 | Example 4 |
|---|---|---|---|
| Powdered substrate's raw material | | Powdered natural silica Particle diameter: 50 to 500 μm Purity: 99.999% by weight | Powdered natural silica Particle diameter: 50 to 500 μm Purity: 99.999% by weight |
| Powdered inner-layer's raw material | Powdered base material | Powdered natural silica Particle diameter: 50 to 500 μm Purity: 99.9999% by weight | Powdered natural silica Particle diameter: 50 to 500 μm Purity: 99.9999% by weight |
| | Doping of alkaline earth metal element | Ba: 200 ppm by weight | Ba: 500 ppm by weight |
| | Doping of hydrogen molecules | $H_2$: 100% by volume, 1 atm, 400° C. Doping amount: $2 \times 10^{17}$ molecules/g | $H_2$: 100% by volume, 9.9 atms, 400° C. Doping amount: $2 \times 10^{18}$ molecules/g |
| Order of preliminary molding and heating of each layer | | Preliminary molding of substrate and melting and sintering of substrate, followed by spreading of powdered inner-layer's raw material and heating | Preliminary molding of substrate and melting and sintering of substrate, followed by spreading of powdered inner-layer's raw material and heating |
| Preliminary molding of substrate | | Rotation molding within frame | Rotation molding within frame |
| Preliminary Molding of inner layer | | — | — |
| Melting and sintering method of substrate | | Arc discharge heating under normal pressure | Arc discharge heating under normal pressure |
| Atmosphere during melting and sintering of substrate | | Air, dew point: 7° C. | Air, dew point: 7° C. |
| Melting method of inner layer | | Spreading of powdered raw material and arc discharge heating under normal pressure | Spreading of powdered raw material and arc discharge heating under normal pressure |

TABLE 2-continued

| Example No. | | Example 3 | Example 4 |
|---|---|---|---|
| Atmosphere of inner layer melting | | Air (dew point: 7° C.) | Air (dew point: 7° C.) |
| Physical properties of substrate | Outer diameter/height/thickness (mm) | Outer diameter 450/height 400/thickness 10 | Outer diameter 450/height 400/thickness 10 |
| | Color tone | White opaque (outside) to white semitransparent (inside) | White opaque (outside) to white semitransparent (inside) |
| | OH group concentration (ppm by weight) | 30 | 25 |
| | Al Concentration (ppm by weight) | 3 | 3 |
| Physical properties of inner layer | Thickness (mm) | 5 | 5 |
| | Color tone | Colorless and transparent | Colorless and transparent |
| | OH group concentration (ppm by weight) | 50 | 60 |
| | Al Concentration (ppm by weight) | 3 | 3 |
| | Concentration of alkaline earth metal element (ppm by weight) | Ba: 190 | Ba: 450 |
| | Alkaline metal concentration (ppb by weight) | Li: 10, Na: 60, K: 10 | Li: 5, Na: 50, K: 10 |
| | Release amount of hydrogen molecules (molecules/g) | $<1 \times 10^{16}$ | $<1 \times 10^{16}$ |
| | Light transmittance at 600 nm (%) | 92.8 | 92.6 |
| Evaluation | Single crystal multipulling | Good | Good |
| | Void/pinhole of single crystal | Fair | Fair |
| | Container etching resistance | Fair | Good |
| | Impurity diffusion from container | Fair | Good |
| | Production cost of container | Good | Good |

TABLE 3

| Example No. | | Example 5 | Example 6 |
|---|---|---|---|
| Powdered substrate's raw material | | Powdered natural silica Particle diameter: 50 to 500 μm Purity: 99.999% by weight | Powdered natural silica Particle diameter: 50 to 500 μm Purity: 99.999% by weight |
| Powdered inner-layer's raw material | Powdered base material | Powdered natural silica Particle diameter: 50 to 500 μm Purity: 99.9999% by weight | Powdered natural silica Particle diameter: 50 to 500 μm Purity: 99.9999% by weight |
| | Doping of alkaline earth metal element | Ba: 200 ppm by weight | Ba: 200 ppm by weight |
| | Doping of hydrogen molecules | $H_2$: 100% by volume, 1 atm, 400° C. Doping amount: $2 \times 10^{17}$ molecules/g | $H_2$: 100% by volume, 1 atm, 400° C. Doping amount: $2 \times 10^{17}$ molecules/g |
| Order of preliminary molding and heating of each layer | | Preliminary molding of substrate and melting and sintering of substrate, followed by spreading of powdered inner-layer's raw material and heating | Preliminary molding of substrate and melting and sintering of substrate, followed by spreading of powdered inner-layer's raw material and heating |
| Preliminary molding of substrate | | Rotation molding within frame | Rotation molding within frame |
| Preliminary molding of inner layer | | — | — |
| Melting and sintering method of substrate | | Arc discharge heating under normal pressure | Arc discharge heating under aspiration |
| Atmosphere during melting and sintering of substrate | | Air, dew point: 3° C. | Air, dew point: 3° C. |
| Melting method of inner layer | | Spreading of powdered raw material and arc discharge heating under normal pressure | Spreading of powdered raw material and arc discharge heating under aspiration |
| Atmosphere of inner layer melting | | Air, dew point: 3° C. | Air, dew point: 3° C. |
| Physical properties of substrate | Outer diameter/height/thickness (mm) | Outer diameter 450/height 400/thickness 10 | Outer diameter 450/height 400/thickness 10 |
| | Color tone | White opaque (outside) to white semitransparent (inside) | White opaque (outside) to colorless transparent (inside) |
| | OH group concentration (ppm by weight) | 20 | 8 |
| | Al Concentration (ppm by weight) | 50 | 50 |

TABLE 3-continued

| Example No. | | Example 5 | Example 6 |
|---|---|---|---|
| Physical properties of inner layer | Thickness (mm) | 5 | 5 |
| | Color tone | Colorless and transparent | Colorless and transparent |
| | OH group concentration (ppm by weight) | 15 | 12 |
| | Al Concentration (ppm by weight) | 30 | 30 |
| | Concentration of alkaline earth metal element (ppm by weight) | Ba: 180 | Ba: 170 |
| | Alkaline metal concentration (ppb by weight) | Li: 10, Na: 60, K: 15 | Li: 5, Na: 50, K: 10 |
| | Release amount of hydrogen molecules (molecules/g) | $<1 \times 10^{16}$ | $<1 \times 10^{16}$ |
| | Light transmittance at 600 nm (%) | 93.0 | 93.1 |
| Evaluation | Single crystal multipulling | Good | Good |
| | Void/pinhole of single crystal | Fair | Good |
| | Container etching resistance | Fair | Good |
| | Impurity diffusion from container | Good | Good |
| | Production cost of container | Good | Fair |

TABLE 4

| Example No. | | Example 7 | Example 8 |
|---|---|---|---|
| Powdered substrate's raw material | | Powdered natural silica Particle diameter: 50 to 500 μm Purity: 99.999% by weight | Powdered natural silica Particle diameter: 50 to 500 μm Purity: 99.999% by weight |
| Powdered inner-layer's raw material | Powdered base material | Powdered natural silica Particle diameter: 50 to 500 μm Purity: 99.9999% by weight | Powdered natural silica Particle diameter: 50 to 500 μm Purity: 99.9999% by weight |
| | Doping of alkaline earth metal element | Ba: 120 ppm by weight | Ba: 100 ppm by weight, Sr: 20 ppm by weight |
| | Doping of hydrogen molecules | $H_2$: 100% by volume, 2 atms, 400° C. Doping amount: $4 \times 10^{17}$ molecules/g | $H_2$: 100% by volume, 2 atms, 400° C. Doping amount: $4 \times 10^{17}$ molecules/g |
| Order of preliminary molding and heating of each layer | | Preliminary molding of substrate and melting and sintering of substrate, followed by spreading of powdered inner-layer's raw material and heating | Preliminary molding of substrate and melting and sintering of substrate, followed by spreading of powdered inner-layer's raw material and heating |
| Preliminary molding of substrate | | Rotation molding within frame | Rotation molding within frame |
| Preliminary molding of inner layer | | — | — |
| Melting and sintering method of substrate | | Arc discharge heating under aspiration | Arc discharge heating under aspiration |
| Atmosphere during melting and sintering of substrate | | Air, dew point: 7° C. | Air, dew point: 7° C. |
| Melting method of inner layer | | Spreading of powdered raw material and arc discharge heating under aspiration | Spreading of powdered raw material and arc discharge heating under aspiration |
| Atmosphere of inner layer melting | | Air, dew point: 7° C. | Air, dew point: 3° C. |
| Physical properties of substrate | Outer diameter/height/thickness (mm) | Outer diameter 450/height 400/thickness 10 | Outer diameter 450/height 400/thickness 10 |
| | Color tone | White opaque (outside) to colorless transparent (inside) | White opaque (outside) to colorless transparent (inside) |
| | OH group concentration (ppm by weight) | 9 | 8 |
| | Al Concentration (ppm by weight) | 15 | 15 |
| Physical Properties of inner layer | Thickness (mm) | 5 | 5 |
| | Color tone | Colorless and transparent | Colorless and transparent |
| | OH group concentration (ppm by weight) | 12 | 13 |
| | Al Concentration (ppm by weight) | 10 | 10 |
| | Concentration of alkaline earth metal element (ppm by weight) | Ba: 100 | Ba: 90, Sr: 18 |
| | Alkaline metal concentration (ppb by weight) | Li: 2, Na: 10, K: 15 | Li: 2, Na: 10, K: 15 |

TABLE 4-continued

| Example No. | | Example 7 | Example 8 |
|---|---|---|---|
| | Release amount of hydrogen molecules (molecules/g) | $<1 \times 10^{16}$ | $<1 \times 10^{16}$ |
| | Light transmittance at 600 nm (%) | 92.7 | 92.8 |
| Evaluation | Single crystal multipulling | Good | Good |
| | Void/pinhole of single crystal | Good | Good |
| | Container etching resistance | Fair | Fair |
| | Impurity diffusion from container | Good | Good |
| | Production cost of container | Fair | Fair |

TABLE 5

| Example No. | | | Comparative Example 1 | Comparative Example 2 |
|---|---|---|---|---|
| Powdered substrate's raw material | | | Powdered natural silica Particle diameter: 50 to 500 μm Purity: 99.9999% by weight | Powdered natural silica Particle diameter: 50 to 500 μm Purity: 99.9999% by weight |
| Powdered inner-layer's raw material | Powdered base material | | Powdered natural silica Particle diameter: 50 to 500 μm Purity: 99.9999% by weight | Powdered natural silica Particle diameter: 50 to 500 μm Purity: 99.9999% by weight |
| | Doping of alkaline earth metal element | | None | Ba: 500 ppm by weight |
| | Doping of hydrogen molecules | | None | None |
| Order of preliminary molding and heating of each layer | | | Preliminary molding of substrate and melting and sintering of substrate, followed by spreading of powdered inner-layer's raw material and heating | Preliminary molding of substrate and melting and sintering of substrate, followed by spreading of powdered inner-layer's raw material and heating |
| Preliminary molding of substrate | | | Rotation molding within frame | Rotation molding within frame |
| Preliminary molding of inner layer | | | — | — |
| Melting and sintering method of substrate | | | Arc discharge heating under normal pressure | Arc discharge heating under normal pressure |
| Atmosphere during melting and sintering of substrate | | | Air, dew point: 15° C. | Air, dew point: 15° C. |
| Melting method of inner layer | | | Spreading of powdered raw material and arc discharge heating under normal pressure | Spreading of powdered raw material and arc discharge heating under normal pressure |
| Atmosphere of inner layer melting | | | Air, dew point; 15° C. | Air, dew point: 15° C. |
| Physical properties of substrate | Outer diameter/height/thickness (mm) | | Outer diameter 450/height 400/thickness 12 | Outer diameter 450/height 400/thickness 12 |
| | Color tone | | White opaque (outside) to white semitransparent (inside) | White opaque (outside) to white semitransparent (inside) |
| | OH group concentration (ppm by weight) | | 110 | 100 |
| | Al Concentration (ppm by weight) | | 3 | 3 |
| Physical properties of inner layer | Thickness (mm) | | 3 | 3 |
| | Color tone | | Colorless and transparent | Colorless and transparent |
| | OH group concentration (ppm by weight) | | 160 | 120 |
| | Al Concentration (ppm by weight) | | 3 | 3 |
| | Concentration of alkaline earth metal element (ppm by weight) | | <1 | Ba: 450 |
| | Alkaline metal concentration (ppb by weight) | | Li: 10, Na: 50, K: 10 | Li: 10, Na: 50, K: 20 |
| | Release amount of hydrogen molecules (molecules/g) | | $<1 \times 10^{16}$ | $<1 \times 10^{16}$ |
| | Light transmittance at 600 nm (%) | | 92.5 | 91.3 |

TABLE 5-continued

| Example No. | | Comparative Example 1 | Comparative Example 2 |
|---|---|---|---|
| Evaluation | Single crystal multipulling | Fair | Good |
| | Void/pinhole of single crystal | Fair | Poor |
| | Container etching resistance | Poor | Good |
| | Impurity diffusion from container | Good | Good |
| | Production cost of container | Poor | Poor |

TABLE 6

| Example No. | | | Comparative Example 3 | Comparative Example 4 |
|---|---|---|---|---|
| Powdered substrate's raw material | | | Powdered natural silica Particle diameter: 50 to 500 µm Purity: 99.9999% by weight | Powdered natural silica Particle diameter: 50 to 500 µm Purity: 99.99% by weight |
| Powdered inner-layer's raw material | Powdered base material | | Powdered natural silica Particle diameter: 50 to 500 µm Purity: 99.9999% by weight | Powdered natural silica Particle diameter: 50 to 500 µm Purity: 99.9999% by weight |
| | Doping of alkaline earth metal element | | Ba: 30 ppm by weight | None |
| | Doping of hydrogen molecules | | $H_2$: 10% by volume, $N_2$: 90% by volume, 1 atm, 400° C. Doping amount: $2 \times 10^{16}$ molecules/g | None |
| Order of preliminary molding and heating of each layer | | | Preliminary molding of substrate and melting and sintering of substrate, followed by spreading of powdered inner-layer's raw material and heating | Preliminary molding of substrate and melting and sintering of substrate, followed by spreading of powdered inner-layer's raw material and heating |
| Preliminary molding of substrate | | | Rotation molding within frame | Rotation molding within frame |
| Preliminary molding of inner layer | | | — | — |
| Melting and sintering method of substrate | | | Arc discharge heating under normal pressure | Arc discharge heating under normal pressure |
| Atmosphere during melting and sintering of substrate | | | Air, dew point: 18° C. | Air, dew point: 18° C. |
| Melting method of inner layer | | | Spreading of powdered raw material and arc discharge heating under normal pressure | Spreading of powdered raw material and arc discharge heating under normal pressure |
| Atmosphere of inner layer melting | | | Air, dew point: 18° C. | Air, dew point: 18° C. |
| Physical properties of substrate | Outer diameter/height/thickness (mm) | | Outer diameter 450/height 400/thickness 12 | Outer diameter 450/height 400/thickness 12 |
| | Color tone | | White opaque (outside) to white semitransparent (inside) | White opaque (outside) to white semitransparent (inside) |
| | OH group concentration (ppm by weight) | | 120 | 130 |
| | Al Concentration (ppm by weight) | | 3 | 3 |
| Physical properties of inner layer | Thickness (mm) | | 3 | 3 |
| | Color tone | | Colorless and transparent | Colorless and transparent |
| | OH group concentration (ppm by weight) | | 180 | 180 |
| | Al Concentration (ppm by weight) | | 3 | 3 |
| | Concentration of alkaline earth metal element (ppm by weight) | | Ba: 27 | <1 |
| | Alkaline metal concentration (ppb by weight) | | Li: 8, Na: 40, K: 10 | Li: 10, Na: 90, K: 20 |
| | Release amount of hydrogen molecules (molecules/g) | | $1 \times 10^{16}$ | $1 \times 10^{16}$ |
| | Light transmittance at 600 nm (%) | | 93.0 | 92.6 |
| Evaluation | Single crystal multipulling | | Fair | Fair |
| | Void/pinhole of single crystal | | Poor | Poor |
| | Container etching resistance | | Fair | Poor |
| | Impurity diffusion from container | | Good | Poor |
| | Production cost of container | | Poor | Good |

TABLE 7

| Example No. | | Comparative Example 5 | Comparative Example 6 |
|---|---|---|---|
| Powdered substrate's raw material | | Powdered natural silica Particle diameter: 50 to 500 μm Purity: 99.999% by weight | Powdered natural silica Particle diameter: 50 to 500 μm Purity: 99.999% by weight |
| Powdered inner-layer's raw material | Powdered base material | Powdered natural silica Particle diameter: 50 to 500 μm Purity: 99.9999% by weight | Powdered natural silica Particle diameter: 50 to 500 μm Purity: 99.9999% by weight |
| | Doping of alkaline earth metal element | Ba: 200 ppm by weight | None |
| | Doping of hydrogen molecules | None | $H_2$: 100% by volume, 1 atm, 400° C. Doping amoung: $2 \times 10^{17}$ molecules/g |
| Order of preliminary molding and heating of each layer | | Preliminary molding of substrate and inner layer, followed by simultaneous heating | Preliminary molding of substrate and inner layer, followed by simultaneous heating |
| Preliminary molding of substrate | | Rotation molding within frame | Rotation molding within frame |
| Preliminary molding of inner layer | | Rotation molding within frame | Rotation molding within frame |
| Melting and sintering method of substrate | | Arc discharge heating under aspiration | Arc discharge heating under aspiration |
| Atmosphere during melting and sintering of substrate | | Air, dew point: 7° C. | Air, dew point: 7° C. |
| Melting method of inner layer | | Arc discharge melting under aspiration | Arc discharge melting under aspiration |
| Atmosphere of inner layer melting | | Air, dew point: 7° C. | Air, dew point: 7° C. |
| Physical properties of substrate | Outer diameter/height/thickness (mm) | Outer diameter 450/height 400/thickness 10 | Outer diameter 450/height 400/thickness 10 |
| | Color tone | White opaque (outside) to colorless transparent (inside) | White opaque (outside) to colorless transparent (inside) |
| | OH group concentration (ppm by weight) | 10 | 10 |
| | Al Concentration (ppm by weight) | 3 | 3 |
| Physical properties of inner layer | Thickness (mm) | 5 | 5 |
| | Color tone | Colorless and transparent | Colorless and transparent |
| | OH group concentration (ppm by weight) | 30 | 25 |
| | Al Concentration (ppm by weight) | 3 | 3 |
| | Concentration of alkaline earth metal element (ppm by weight) | Ba: 180 | <1 |
| | Alkaline metal concentration (ppb by weight) | Li: 10, Na: 60, K: 20 | Li: 10, Na: 50, K: 15 |
| | Release amount of hydrogen molecules (molecules/g) | $<1 \times 10^{16}$ | $<1 \times 10^{16}$ |
| | Light transmittance at 600 nm (%) | 91.7 | 93.2 |
| Evaluation | Single crystal multipulling | Good | Fair |
| | Void/pinhole of single crystal | Poor | Fair |
| | Container etching resistance | Fair | Poor |
| | Impurity diffusion from container | Fair | Poor |
| | Production cost of container | Fair | Fair |

As can be seen in Tables 1 to 7, in Examples 1 to 8 in accord with the method for producing a silica container of the present invention, the silica containers giving the results in pulling up of a single crystal no way inferior to conventional silica containers of Comparative Examples 1 and 2 could be obtained, in spite of the silica containers produced with a low cost and a higher productivity.

Accordingly, in Examples 1 to 8, multipulling of a silicon single crystal could be done with a high success rate; and thus formation of voids and pinholes could be made in the same level or lower as compared with Comparative Examples 1 and 2, and in addition, an etching resistance could be obtained as well in Examples 1 to 8.

In Comparative Example 3, content of alkaline earth metal elements and concentration of hydrogen molecules in the powdered inner-layer's raw material were low so that the etching resistance was insufficient.

In Comparative Example 4, the silica container could be produced in a low cost; but there were many problems, such as many voids and pinholes, low etching resistance, and large diffusion of impurities.

In Comparative Example 5, there appeared many voids and pinholes; this is caused probably because hydrogen molecules were not added into the powdered inner-layer's raw material although the added amount of Ba was large.

In Comparative Example 6, the etching resistance of the silica container was low and suppression of the impurity diffusion was inadequate; this is caused probably, on the contrary, because Ba was not added into the powdered inner-layer's raw material although the added amount of hydrogen molecules was large.

It must be noted here that the present invention is not limited to the embodiments as described above. The foregoing embodiments are mere examples; any form having substantially the same composition as the technical concept described in claims of the present invention and showing similar effects is included in the technical scope of the present invention.

The invention claimed is:

1. A powdered silica for producing a silica container, wherein the powdered silica has particle diameter of 10 to 1000 μm, contains Ca, Sr, and Ba with the total concentration of 50 to 5000 ppm by weight, and releases hydrogen molecules with the amount of $3\times10^{16}$ to $3\times10^{19}$ molecules/g upon heating at 1000° C. under vacuum.

2. The powdered silica according to claim 1, wherein the powdered silica contains Ba with the concentration of 100 to 1000 ppm by weight, releases hydrogen molecules with the amount of $5\times10^{16}$ to $5\times10^{18}$ molecules/g upon heating at 1000° C. under vacuum, and contains Li, Na, and K with concentration of each being 60 or less ppb by weight.

3. The powdered silica according to claim 1, wherein the powdered silica contains Al with the concentration of 10 to 100 ppm by weight.

4. The powdered silica according to claim 3, wherein the powdered silica contains Ba with the concentration of 100 to 1000 ppm by weight, releases hydrogen molecules with the amount of $5\times10^{16}$ to $5\times10^{18}$ molecules/g upon heating at 1000° C. under vacuum, and contains Li, Na, and K with concentration of each being 60 or less ppb by weight.

5. A method for producing a powdered silica for production of a silica container, wherein the method comprises:
   a step of preparing powders having particle diameter of 10 to 1000 μm and comprised of a silica containing at least one of Ca, Sr, and Ba,
   a step of feeding the powders into an air-tight furnace,
   a step of evacuating inside the furnace to $10^3$ Pa or lower by aspiration,
   a step of conducting heat-treatment at 200 to 800° C. with introducing a gas containing 10 to 100% by volume of a hydrogen gas into the furnace whereby making a pressure of the hydrogen-containing atmosphere between 1 and 100 kgf/cm$^2$, and
   a step of cooling the powders to 50° C. or lower with maintaining the pressure of the hydrogen-containing atmosphere inside the furnace at 1 kgf/cm$^2$ or higher.

6. The method for producing a powdered silica according to claim 5, wherein the powdered silica is made to contain Ca, Sr, and Ba with the total concentration of 50 to 5000 ppm by weight.

7. The method for producing a powdered silica according to claim 5, wherein the powdered silica is made to contain Ba with the concentration of 100 to 1000 ppm by weight and Al with the concentration of 10 to 100 ppm by weight, respectively.

8. A silica container arranged with a substrate, having a rotational symmetry, comprised of mainly a silica, and containing gaseous bubbles at least in its peripheral part, and an inner layer, formed on an inner surface of the substrate and comprised of a transparent silica glass; wherein the substrate contains Li, Na, and K with the total concentration of 50 or less ppm by weight, and the inner layer contains Ca, Sr, and Ba with the total concentration of 50 to 5000 ppm by weight and shows a light transmittance of 91.8 to 93.2% at a light wavelength of 600 nm for a cut-out sample having 10 mm thickness.

9. The silica container according to claim 8, wherein the inner layer contains Al with the concentration of 10 to 100 ppm by weight.

10. The silica container according to claim 8, wherein the inner layer contains Li, Na, and K with the concentration of each being 60 or less ppb by weight, contains Ba with the concentration of 100 to 1000 ppm by weight, and releases hydrogen molecules from a sample cut-out from the inner wall with the amount of less than $1\times10^{16}$ molecules/g upon heating at 1000° C. under vacuum.

11. A method for producing a silica container arranged with a substrate, having a rotational symmetry, comprised of mainly a silica, and containing gaseous bubbles at least in its peripheral part, and an inner layer, formed on an inner surface of the substrate and comprised of a transparent silica glass; wherein a powdered silica, having particle diameter of 10 to 1000 μm, containing Ca, Sr, and Ba with the total concentration of 50 to 5000 ppm by weight, and releasing hydrogen molecules with the amount of $3\times10^{16}$ to $3\times10^{19}$ molecules/g upon heating at 1000° C. under vacuum, is prepared at least as a powdered raw material for forming the inner layer, and then the inner layer is formed on an inner surface of the substrate by using the powdered silica as the powdered raw material for forming the inner layer.

12. The method for producing a silica container according to claim 11, wherein the method comprises:
   a step of preparing powders containing Li, Na, and K with the total concentration of 50 or less ppm by weight and having particle diameter of 10 to 1000 μm as a powdered raw material for forming the substrate,
   a step of forming a preliminarily molded substrate, wherein the powdered raw material for forming the substrate is fed to an inner wall of an outer frame having a rotational symmetry, and then preliminarily molded to an intended shape in accordance with the inner wall of the outer frame,
   a step of forming a substrate by heating at high temperature from an inner side of the preliminarily molded substrate by a discharge-heat melting method, and
   a step of forming the inner layer on an inner surface of the substrate, wherein the powdered silica prepared as the powdered raw material for forming the inner layer is spread from inside of the substrate with heating at high temperature from its inside by a discharge-heat melting method.

13. The method for producing a silica container according to claim 11, wherein the method comprises:
   a step of preparing powders containing Li, Na, and K with the total concentration of 50 or less ppm by weight and having particle diameter of 10 to 1000 μm as a powdered raw material for forming the substrate,
   a step of forming a preliminarily molded substrate, wherein, while rotating an evacuable outer frame, having a rotational symmetry and aspiration holes arranged splittingly in its inner wall, the powdered raw material for forming the substrate is fed to an inner wall of the evacuable outer frame and then preliminarily molded to an intended shape in accordance with the inner wall of the evacuable outer frame,
   a step of forming a preliminarily molded inner layer, wherein, while rotating the evacuable outer frame, the powdered silica prepared as the powdered raw material for forming the inner layer is fed onto an inner surface of the preliminarily molded substrate and then preliminarily molded to an intended shape in accordance with an inner surface of the preliminarily molded substrate, and
   a step of forming the substrate and the inner layer, wherein the preliminarily molded substrate and inner layer are degassed by aspiration from an outer peripheral side of the preliminarily molded substrate through the aspiration holes formed in the evacuable outer frame, with heating from inside of the preliminarily molded substrate and inner layer by a discharge-heat melting method thereby making an outer peripheral part of the preliminarily molded substrate to a sintered body while an inner side part of the preliminarily molded substrate and the preliminarily molded inner layer to a fused glass body.

14. The method for producing a silica container according to claim 13, wherein at least one of the discharge-heat melting steps is carried out under a mixed atmosphere of an inert gas containing 1 to 30% by volume of an oxygen gas.

15. The method for producing a silica container according to claim 13, wherein at least one of the discharge-heat melting steps is carried out under an air atmosphere with setting a dew-point temperature in the range between 10 and $-10°$ C. and with controlling the temperature within $\pm 1°$ C. of the set dew-point temperature.

16. The method for producing a silica container according to claim 11, wherein the method comprises:
a step of preparing powders containing Li, Na, and K with the total concentration of 50 or less ppm by weight and having particle diameter of 10 to 1000 μm as a powdered raw material for forming the substrate,
a step of forming a preliminarily molded substrate, wherein, while rotating an evacuable outer frame, having a rotational symmetry and aspiration holes arranged splittingly in its inner wall, the powdered raw material for forming the substrate is fed to an inner wall of the evacuable outer frame and then preliminarily molded to an intended shape in accordance with the inner wall of the evacuable outer frame,
a step of forming the substrate, wherein the preliminarily molded substrate is degassed by aspiration from its outer peripheral side through aspiration holes formed in the evacuable outer frame with heating at high temperature from inside of the preliminarily molded substrate by a discharge-heat melting method thereby making an outer peripheral part of the preliminarily molded substrate to a sintered body while an inner side part to a fused glass body, and
a step of forming the inner layer on an inner surface of the substrate, wherein the powdered silica prepared as the powdered raw material for forming the inner layer is spread from inside of the substrate with heating at high temperature from its inside by a discharge-heat melting method.

17. The method for producing a silica container according to claim 16, wherein the step of forming the inner layer is conducted with degassing through aspiration holes formed in the evacuable outer frame.

18. The method for producing a silica container according to claim 16, wherein at least one of the discharge-heat melting steps is carried out under a mixed atmosphere of an inert gas containing 1 to 30% by volume of an oxygen gas.

19. The method for producing a silica container according to claim 16, wherein at least one of the discharge-heat melting steps is carried out under an air atmosphere with setting a dew-point temperature in the range between 10 and $-10°$ C. and with controlling the temperature within $\pm 1°$ C. of the set dew-point temperature.

* * * * *